United States Patent
Hashimoto

(10) Patent No.: US 9,263,153 B2
(45) Date of Patent: *Feb. 16, 2016

(54) SEMICONDUCTOR STORAGE DEVICE, NONVOLATILE SEMICONDUCTOR MEMORY TEST METHOD, AND MEDIUM

(71) Applicant: KABUSHIKI KAISHA TOSHIBA, Tokyo (JP)

(72) Inventor: Daisuke Hashimoto, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/964,316

(22) Filed: Aug. 12, 2013

(65) Prior Publication Data

US 2013/0332802 A1    Dec. 12, 2013

Related U.S. Application Data

(63) Continuation of application No. 13/602,763, filed on Sep. 4, 2012, now Pat. No. 8,539,315.

(30) Foreign Application Priority Data

Dec. 16, 2011    (JP) ................... 2011-275867
Apr. 5, 2012    (JP) ................... 2012-086657

(51) Int. Cl.
*G11C 29/00* (2006.01)
*G11C 7/00* (2006.01)
(Continued)

(52) U.S. Cl.
CPC ............ *G11C 29/04* (2013.01); *G11C 11/5628* (2013.01); *G11C 16/00* (2013.01); *G11C 29/06* (2013.01); *G11C 29/08* (2013.01); *G11C 29/44* (2013.01); *G11C 29/52* (2013.01);
(Continued)

(58) Field of Classification Search
None
See application file for complete search history.

(56) References Cited

U.S. PATENT DOCUMENTS 6,684,173 B2    1/2004  Kessenich et al.
7,939,892 B2 *  5/2011  Tran et al. .................... 257/355
(Continued)

FOREIGN PATENT DOCUMENTS

JP    4439539    1/2010
JP    2010-161199    7/2010
(Continued)

OTHER PUBLICATIONS

Editor Curtis E. Stevens, "Information Technology—ATA/ATAPI Command Set-2 (ACS-2)", Working Draft Project American National Standard, T13/2015-D, Revision 6, Feb. 22, 2011, 10 Pages.

*Primary Examiner* — Justin R Knapp
(74) *Attorney, Agent, or Firm* — Oblon, McClelland, Maier & Neustadt, L.L.P.

(57) ABSTRACT

According to one embodiment, a semiconductor storage device includes a nonvolatile semiconductor memory and a controller. The nonvolatile semiconductor memory includes a firmware area capable of storing firmware used to execute either a normal mode or an autorun test mode and a user area capable of storing user data. The controller reads the firmware from the nonvolatile semiconductor memory and determines whether the firmware has been set in either the normal mode or the autorun test mode. The controller repeats erasing, writing, and reading in each block in the user area using a cell applied voltage higher than a voltage used in a normal mode, and enters a block where an error has occurred as a bad block.

21 Claims, 15 Drawing Sheets

(51) Int. Cl.
  *G11C 29/04* (2006.01)
  *G11C 16/00* (2006.01)
  *G11C 29/06* (2006.01)
  *G11C 29/08* (2006.01)
  *G11C 29/44* (2006.01)
  *G11C 29/52* (2006.01)
  *G11C 11/56* (2006.01)

(52) U.S. Cl.
  CPC ....... *G11C 29/82* (2013.01); *G11C 2029/0409* (2013.01); *G11C 2029/4402* (2013.01)

(56) References Cited

U.S. PATENT DOCUMENTS

| | | |
|---|---|---|
| 7,996,726 B2 | 8/2011 | Ito |
| 8,037,380 B2 | 10/2011 | Cagno et al. |
| 2006/0290365 A1* | 12/2006 | Riedlinger et al. ........... 324/760 |
| 2009/0228641 A1 | 9/2009 | Kurashige |
| 2009/0268516 A1 | 10/2009 | Murin et al. |
| 2009/0285044 A1 | 11/2009 | Chen et al. |
| 2010/0182859 A1 | 7/2010 | Kohler et al. |
| 2011/0128787 A1 | 6/2011 | Shelton et al. |
| 2011/0273834 A1 | 11/2011 | Moriai et al. |
| 2012/0117430 A1* | 5/2012 | Yang et al. ................. 714/718 |
| 2012/0170435 A1* | 7/2012 | Trantham .................. 369/53.42 |
| 2012/0284453 A1 | 11/2012 | Hashimoto |
| 2013/0039139 A1 | 2/2013 | Raval et al. |
| 2013/0124932 A1 | 5/2013 | Schuh et al. |
| 2013/0159785 A1 | 6/2013 | Hashimoto |

FOREIGN PATENT DOCUMENTS

| | | |
|---|---|---|
| JP | 4635061 | 11/2010 |
| JP | 2011-29586 | 2/2011 |

\* cited by examiner

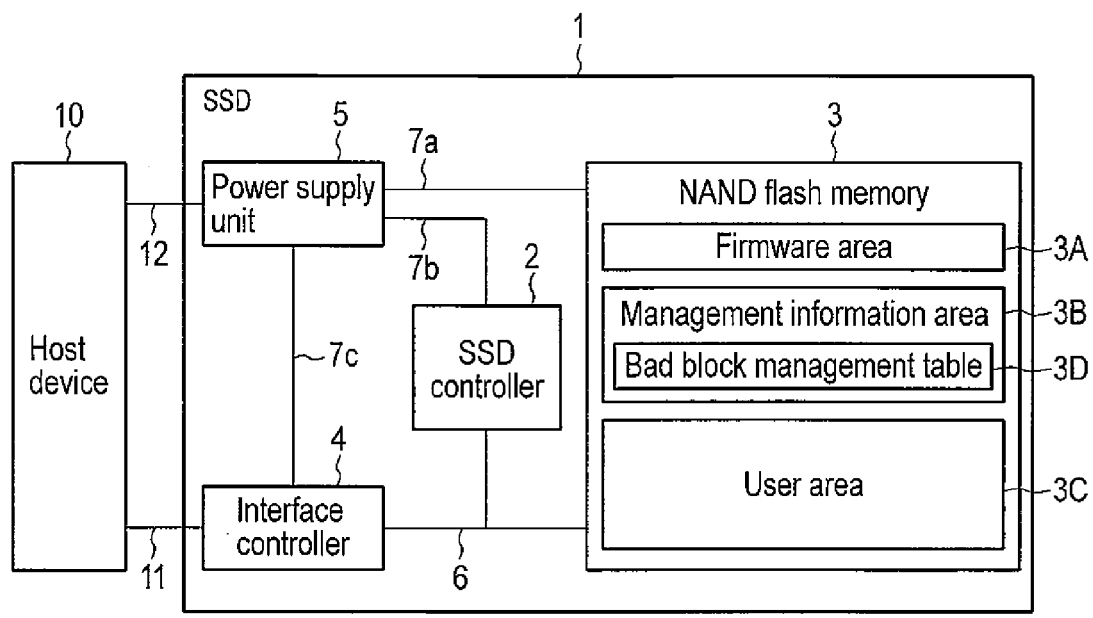
F I G. 1
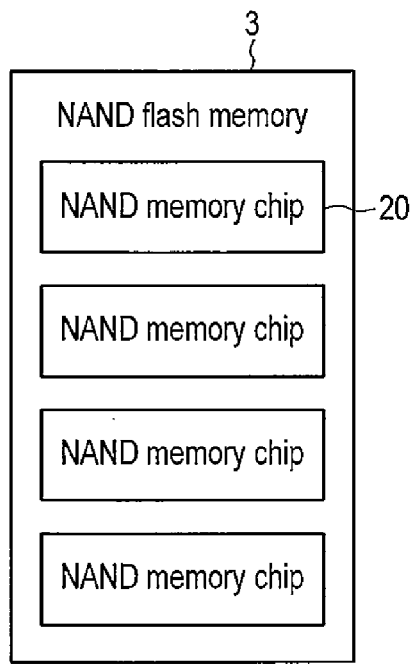
F I G. 2

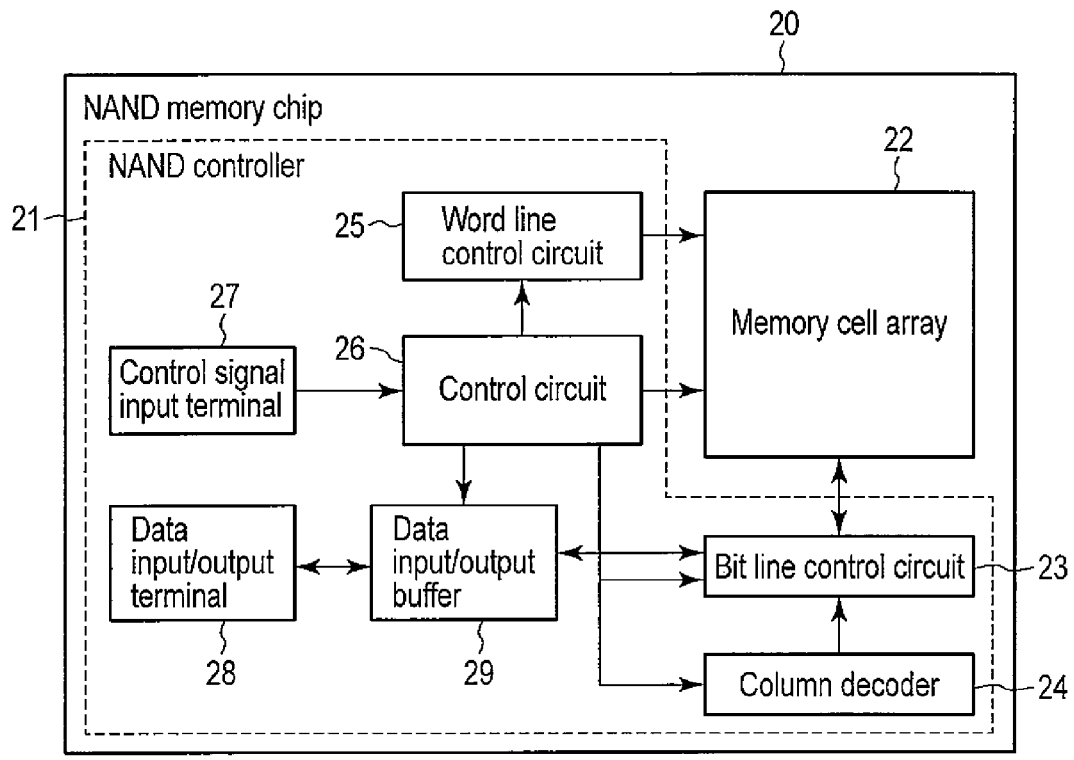
F I G. 3
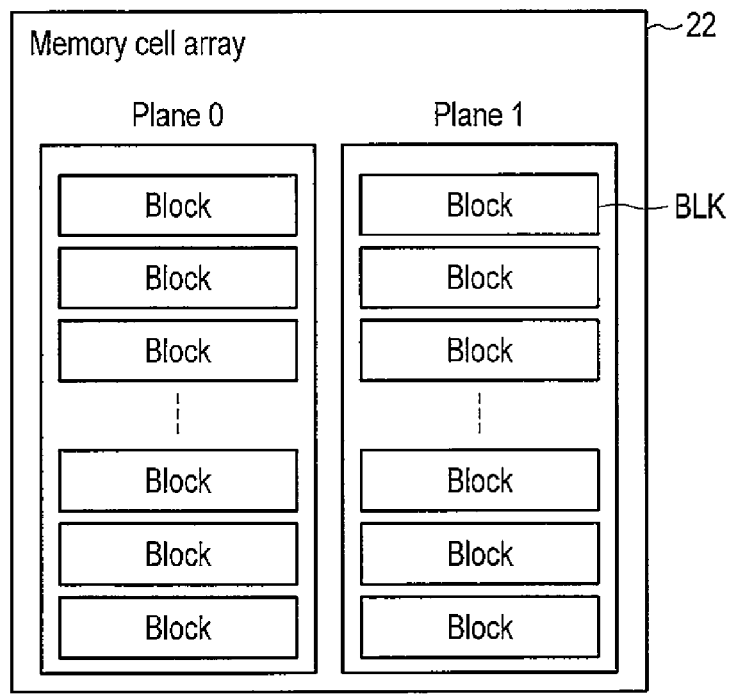
F I G. 4

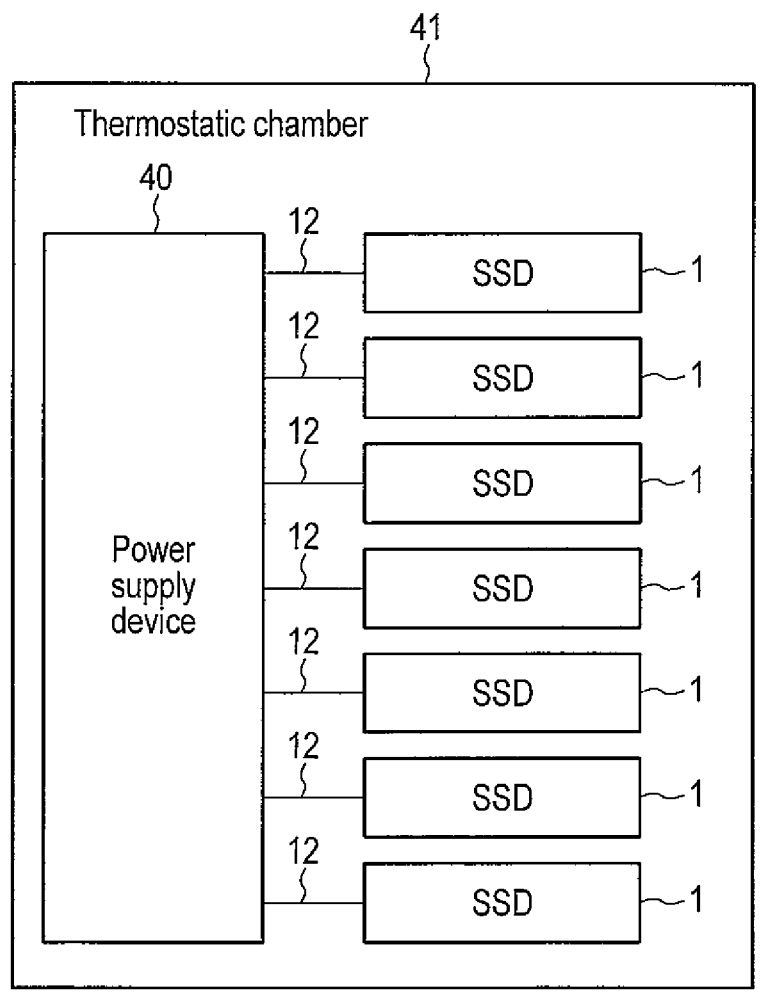
F I G. 11

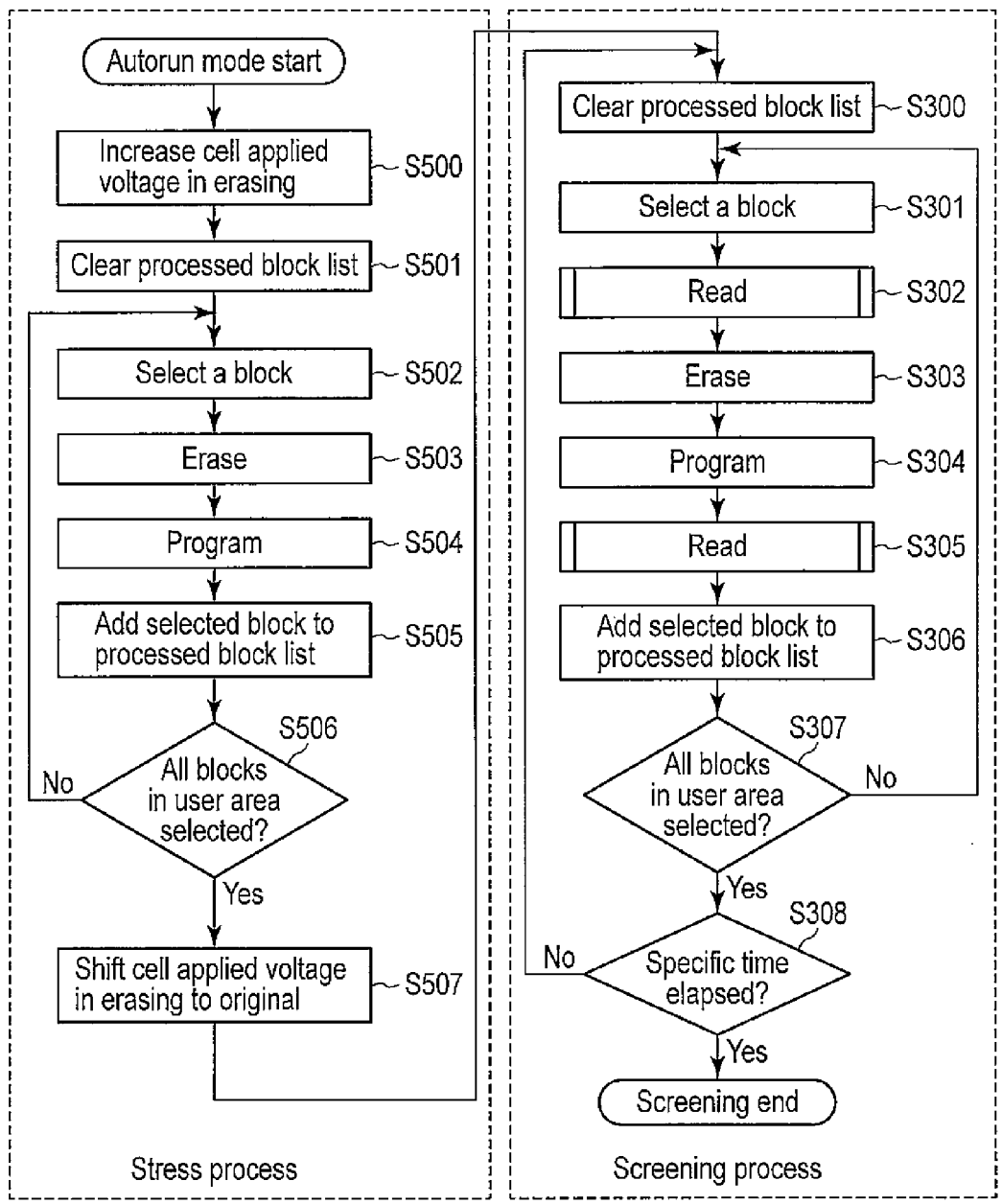
F I G. 12

SEMICONDUCTOR STORAGE DEVICE, NONVOLATILE SEMICONDUCTOR MEMORY TEST METHOD, AND MEDIUM

CROSS-REFERENCE TO RELATED APPLICATIONS

This application is a continuation application of and claims the benefit of priority under 35 U.S.C. §120 from U.S. application Ser. No. 13/602,763, filed Sep. 4, 2012, which is based upon and claims the benefit of priority under 35 U.S.C. §119 from Japanese Patent Applications No. 2011-275867, filed Dec. 16, 2011; and No. 2012-086657, filed Apr. 5, 2012, the entire contents of all of which are incorporated herein by reference.

FIELD

Embodiments described herein relate generally to a semiconductor storage device, a nonvolatile semiconductor memory test method, and a computer-readable medium.

BACKGROUND

Not only a hard disk drive (HDD) but also a solid state drive (SDD) has been used as an external storage device for an information processing device, such as a personal computer. The SDD includes a NAND flash memory as a nonvolatile semiconductor memory.

For example, when the SDD is used in the same environment as the HDD, if data is rewritten frequently, the SDD will age (wear out) faster. Therefore, if test (screening) before product shipment is insufficient, the failure rate after shipment will increase.

One method of increasing the reliability of the SSD is to rewrite data in the SSD repeatedly in the screening process. However, when such screening is performed, screening time and screening costs will increase.

BRIEF DESCRIPTION OF THE DRAWINGS

FIG. 1 is a block diagram showing the configuration of a memory system according to a first embodiment;

FIG. 2 is a block diagram showing the configuration of a NAND flash memory;

FIG. 3 is a block diagram showing the configuration of a NAND memory chip;

FIG. 4 is a block diagram showing the configuration of a memory cell array;

FIG. 11 is a schematic diagram showing a configuration of the screening device;

FIG. 12 is a flowchart to explain an SSD screening operation according to a second embodiment;

DETAILED DESCRIPTION

Figure 5:
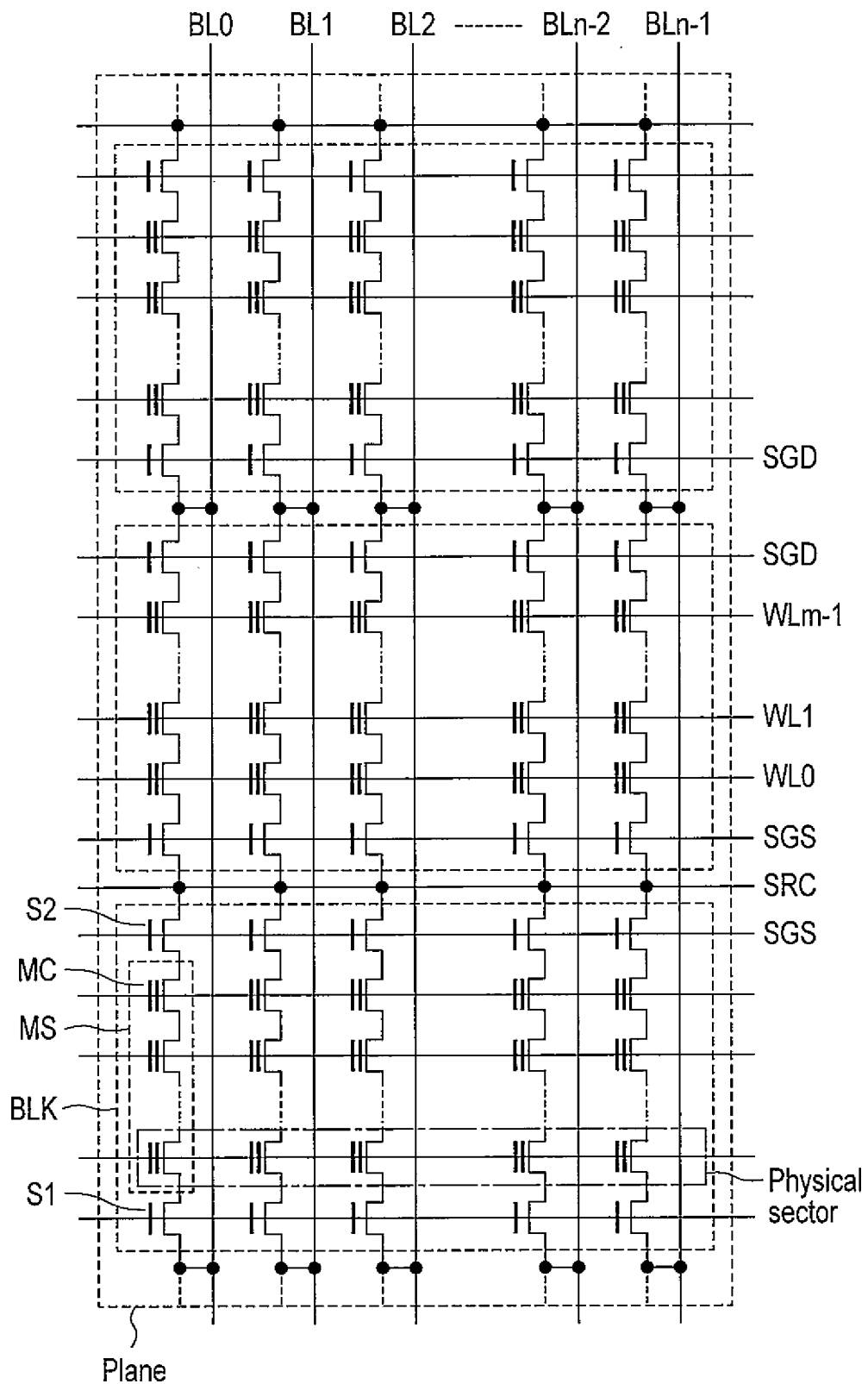
FIG. 5 is a circuit diagram showing the configuration of a plane included in the memory cell array.

In general, according to one embodiment, there is provided a semiconductor storage device comprising a nonvolatile semiconductor memory, a power supply unit, and a first controller, wherein the nonvolatile semiconductor memory comprises:
 a memory cell array including blocks each including memory cells; and
 a second controller configured to control writing of data to, reading of data from, and erasing of data from the memory cells,
 the memory cell array comprises:
 a firmware area capable of storing firmware used to execute either a normal mode in which the first controller performs an operation corresponding to an instruction from a host device or an autorun test mode in which the first controller conducts a specific test, regardless of an instruction from the host device; and
 a user area capable of storing user data,
 the power supply unit configured to receive a power supply from outside the semiconductor storage device and to supply a specific voltage to the nonvolatile semiconductor memory and the first controller,
 the first controller reads the firmware from the nonvolatile semiconductor memory and determines whether the firmware has been set in either the normal mode or the autorun test mode when having received a voltage from the power supply unit, and
  performs a first process, a second process, and a third process in that order when the firmware has been set in the autorun test mode,
 the first process includes writing data to a block in the user area using a first cell applied voltage higher than a voltage used in the normal mode, and not entering a block where an error has occurred as a bad block even when the error has occurred at the time of the writing,
 the second process is used in the normal mode and includes repeating erasing and writing in each block in the user area using a second cell applied voltage lower than the first cell applied voltage, and not entering a block where an error has occurred as a bad block even when the error has occurred at the time of the writing, and
 the third process includes repeating erasing, writing, and reading in each block in the user area using the second cell applied voltage, and entering a block where an error has occurred as a bad block when the error has occurred at the time of erasing or when the error has occurred at the time of the writing.

The embodiments will be described hereinafter with reference to the accompanying drawings. In the description which follows, the same or functionally equivalent elements are denoted by the same reference numerals, to thereby simplify the description.

Each function block can be realized by hardware, computer software, or a combination of both. Therefore, function blocks will be explained below so as to clearly come under any one of the above cases roughly from the viewpoint of their functions. Whether such functions are executed in either hardware or software depends on design constraint imposed on a specific embodiment or the entire system. Those skilled in the art can realize these functions by various methods for each specific embodiment and any realization approach is included in the scope of the embodiments. Although the individual function blocks are distinguished from one another as in illustrative examples below, this is not indispensable. For example, some of the functions may be executed by function blocks differing from the ones exemplified in the explanation below. In addition, an exemplified function block may be divided into finer function sub-blocks. An embodiment is not limited, depending on which function block specifies the embodiment.

[First Embodiment]

[1. Configuration of Memory System]

FIG. 1 is a block diagram showing the configuration of a memory system according to a first embodiment. The memory system comprises a host device 10 and a semiconductor storage device 1 serving as an external storage device. A solid state drive (SSD) including a NAND flash memory is used as the semiconductor storage device 1.

The SSD 1 comprises an SSD controller (storage device controller) 2, a NAND flash memory 3 as a nonvolatile semiconductor memory, an interface controller (interface unit) 4, and a power supply unit 5. The SSD controller 2, interface controller 4, and NAND flash memory 3 are connected to one another with a bus 6.

The power supply unit 5, which is connected to the host device 10 with a power line 12, receives external power supplied from the host device 10. The power supply unit 5 and the NAND flash memory 3 are connected to each other with a power line 7a. The power supply unit 5 and the SSD controller 2 are connected to each other with a power line 7b. The power supply unit 5 and the interface controller 4 are connected to each other with a power line 7c. The power supply unit 5, which generates various voltages by stepping up or stepping down the external power supply, supplies various voltages to the SSD controller 2, NAND flash memory 3, and interface controller 4.

The interface controller 4 is connected to the host device 10 with an interface (I/F) 11. The interface controller 4 performs the process of interfacing with the host device 10. Used as the interface (I/F) 11 are SATA (Serial Advanced Technology Attachment), PCI Express (Peripheral Component Interconnect Express), SAS (Serial Attached SCSI), USB (Universal Serial Bus), and others. In the first embodiment, an explanation will be given, taking as an example a case where SATA is used as the I/F 11.

The NAND flash memory 3 stores data in a nonvolatile manner. Secured in a physical address space of the NAND flash memory 3 are a firmware area 3A in which firmware is to be stored, a management information area 3B in which management information is to be stored, and a user area 3C in which user data is to be stored. A circuit configuration of the NAND flash memory 3 will be described later.

The SSD controller 2 controls various operations of the SSD 1. The SSD controller 2 includes a RAM (a volatile RAM, such as a DRAM or a SRAM, or a nonvolatile RAM, such as a MRAM, a FeRAM, a PRAM, or a ReRAM) as a work area. When having received a power supply from the power line 7b, the SSD controller 2 reads firmware from the firmware area 3A and thereafter performs processing on the basis of the read firmware.

FIG. 2 is a block diagram showing a configuration of the NAND flash memory 3. The NAND flash memory 3 includes one or more NAND memory chips 20. FIG. 3 is a block diagram showing the configuration of a NAND memory chip 20.

A memory cell array 22 is so configured that memory cells enabling data to be electrically rewritten are arranged in a matrix. On the memory cell array 22, a plurality of bit lines, a plurality of word lines, and a common source line are laid. At intersections of the bit lines and word lines, memory cells are arranged.

A word line control circuit 25 serving as a row decoder, which is connected to a plurality of word lines, selects and drives a word line in writing, reading, or erasing data. A bit line control circuit 23, which is connected to a plurality of bit lines, controls a voltage of a bit line in reading, writing, or erasing data. In addition, the bit line control circuit 23 detects data on a bit line in reading data and applies a voltage corresponding to write data to a bit line in writing data. A column decoder 24 generates a column selection signal to select a bit line according to an address and sends the column selection signal to the bit line control circuit 23.

Read data read from the memory cell array 22 goes through the bit line control circuit 23 and a data input/output buffer 29 and is output from a data input/output terminal 28 to the outside. In addition, write data input to the data input/output terminal 28 from the outside goes through the data input/output buffer 29 and is input to the bit line control circuit 23.

The memory cell array 22, bit line control circuit 23, column decoder 24, data input/output buffer 29, and word line control circuit 25 are connected to a control circuit 26. On the basis of a control signal externally input to a control signal input terminal 27, the control circuit 26 generates control signals and control voltages for controlling the memory cell array 22, bit line control circuit 23, column decoder 24, data input/output buffer 29, and word line control circuit 25. Of the NAND memory chip 20, the part excluding the memory cell array 22 is collectively called a memory cell array controller (NAND controller) 21.

FIG. 4 is a block diagram showing a configuration of the memory cell array 22. The memory cell array 22 includes one or more planes (districts). FIG. 4 shows a case where the memory cell 22 includes two planes (plane 0 and plane 1). Each plane includes a plurality of blocks BLKs. Each block BLK is composed of a plurality of memory cells. Data is erased in blocks BLKs.

FIG. 5 is a circuit diagram showing the configuration of a plane included in the memory cell array 22. Each block BLK included in a plane includes a plurality of NAND units. Each NAND unit is composed of a memory string MS composed of a plurality of memory cells MCs connected in series and select gates S1 and S2 connected to both ends of the memory string MS. Select gate S1 is connected to a bit line BL and select gate S2 is connected to a common source line SRC. The control gates of memory cells MCs arranged in the same row are connected to any one of word lines WL0 to WLm−1 in a common connection manner. The select gates S1 are connected to a select line SGD in a common connection manner and the select gates S2 are connected to a select line SGS in a common connection manner.

A memory cell (memory cell transistor) MC is composed of a metal-oxide semiconductor field-effect transistor (MOSFET) that has a stacked gate structure formed on a p-well of a semiconductor substrate. The stacked gate structure includes a charge storage layer (a floating gate electrode) formed above the p-well via a gate insulating film and a control gate electrode formed above the floating gate electrode via an inter-gate insulating film. A threshold voltage varies according to the number of electrons accumulated at the floating gate electrode. A memory cell stores data according to the difference in the threshold voltage.

In the first embodiment, a four-level store method with two bits per cell where each memory cell uses an upper page and a lower page will be explained. However, even when a two-level store method with one bit per cell where each memory cell uses a single page, an eight-level store method with three bits per cell where each memory cell uses an upper page, a middle page, and a lower page, or a multilevel store method with four bits per cell or more is employed, the essence of the first embodiment remains unchanged. The memory cell is not limited to a structure with a floating gate electrode and may have a structure that varies a threshold voltage by causing electrons to be trapped at a nitriding interface as a charge storage layer, such as a MONOS (Metal-Oxide-Nitride-Oxide-Silicon) structure. Similarly, a MONOS memory cell may be configured to store one bit or multiple levels. In addition, a nonvolatile semiconductor memory where memory cells are arranged three-dimensionally as described in U.S. Patent Application Publication No. 2010 0172189 and U.S. Patent Application Publication No. 2010 0254191 may be used.

A plurality of memory cells connected to a word line constitute a physical sector. Data is written or read in physical sectors. A physical sector can be defined independently of a logical sector with a logical block address (LBA) managed by the host device. The size of a physical sector may or may not be the same as that of a logical sector. In the case of a two-bits-per-cell write system (four levels) of the first embodiment, two pages of data are stored in a physical sector. In the case of a one-bit-per-cell write system (two levels), a page of data is stored in a physical sector. In the case of a three-bits-per-cell write system (eight levels), three pages of data are stored in a physical sector.

In a read operation, a verify operation, and a program operation, a word line is selected according to a physical address received from the SSD controller 2, thereby selecting a physical sector. Switching pages in the physical sector is performed on the basis of a physical address. Although in the first embodiment, writing is sometimes represented as programming, writing and programming have the same meaning. In the case of the two-bits-per-cell write system, the SSD controller 2 treats a physical sector as if two pages, an upper page and a lower page, are allocated to the physical sector. Then, the physical addresses are allocated to all the pages. In the two-bits-per-cell write system, threshold voltages in a memory cell are configured to have four distributions.

Figure 6:
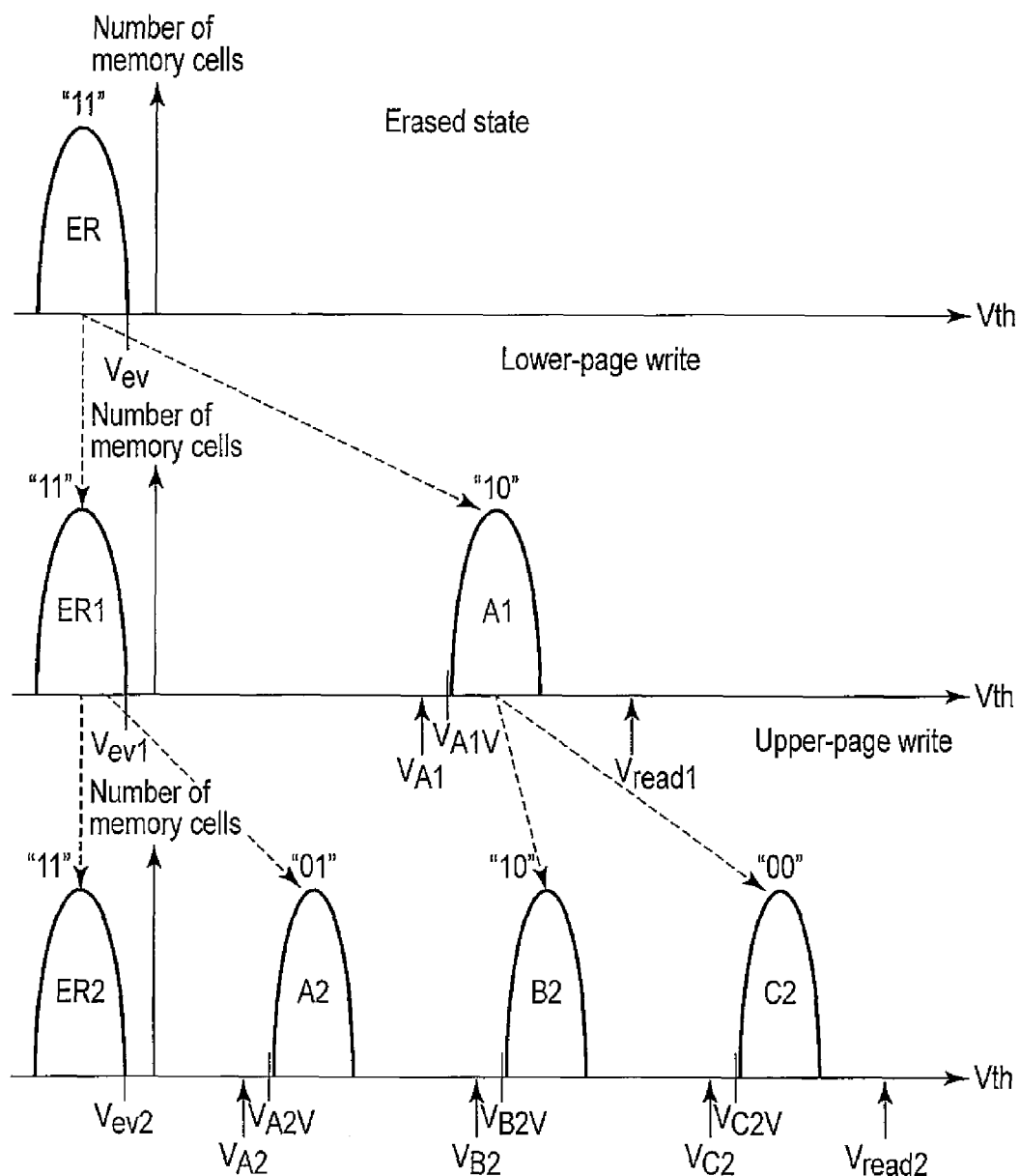
FIG. 6 shows the relationship between 2-bit data and a threshold voltage distribution of a memory cell.

FIG. 6 shows the relationship between 2-bit data (data items 11, 01, 10, and 00) and a threshold voltage distribution of a memory cell. $V_{A1}$ is a voltage applied to the selected word line when two data items are to be read from a physical sector where only the lower page has been written to and the upper page has not been written to. $V_{A1V}$ is a verify voltage applied to the selected word line to verify whether writing has been completed when writing in threshold voltage distribution A1 is performed.

$V_{A2}$, $V_{B2}$, and $V_{C2}$ are voltages applied to the selected word line when four data items are to be read from a physical sector where the lower page and upper page have been written to. $V_{A2V}$, $V_{B2V}$, and $V_{C2V}$ are verify voltages applied to the selected word line to verify whether writing has been completed when writing in each threshold voltage distribution is performed. $V_{read1}$ and $V_{read2}$ are read voltages which are applied to the unselected memory cells when data is to be read and which cause the unselected memory cells to conduct, regardless of what data the unselected memory cells hold.

$V_{ev}$, $V_{ev1}$, and $V_{ev2}$ are erase verify voltages applied to a memory cell to verify whether erasing has been completed when data in the memory cell is to be erased. They each have a negative value. Their magnitudes are determined, taking into account the effect of interference of adjacent memory cells.

The magnitude relation between the individual voltages is as follows:

$V_{ev1} < V_{A1} < V_{A1V} < V_{read1}$ $V_{ev2} < V_{A2} < V_{A2V} < V_{B2} < V_{B2V} < V_{C2} < V_{C2V} < V_{read2}$ Although each of erase verify voltages $V_{ev}$, $V_{ev1}$, and $V_{ev2}$ has a negative value as described above, a voltage actually applied to the control gate of a memory cell in an erase verify operation is at zero or a positive value, not at a negative value. That is, in an actual erase verify operation, a positive voltage is applied to the back gate of the memory cell and a positive voltage lower than zero or the back gate voltage is applied to the control gate of the memory cell. In other words, each of erase verify voltages $V_{ev}$, $V_{ev1}$, and $V_{ev2}$ is a voltage that equivalently has a negative value.

A threshold voltage distribution ER of a memory cell after block erasure, the upper limit of which is also negative, is allocated data item 11. Memory cells with data items 01, 10, and 00 in the lower and upper pages written to have positive threshold voltage distributions A2, B2, and C2, respectively, (the lower limits of A2, B2, and C2 being also at positive values). Threshold voltage distribution A2 of data item 01 has the lowest voltage value and threshold voltage distribution C2 of data item 00 has the highest voltage value. The voltage values of the threshold voltage distributions satisfy the expression A2<B2<C2. A memory cell with data item 10 in the lower page written to and the upper page not written to has a positive threshold voltage distribution A1 (the lower limit of A1 being also at a positive value).

The threshold voltage distributions shown in FIG. 6 are illustrative only and the first embodiment is not limited to those. For example, although the explanation has been given on the assumption that threshold voltage distributions A2, B2, and C2 are all positive threshold voltage distributions in FIG. 6, the scope of the first embodiment includes a case where threshold voltage distribution A2 is a negative voltage distribution and threshold voltage distributions B2, C2 are positive voltage distributions. Even if threshold voltage distributions ER1, ER2 are at positive values, the first embodiment is not limited to this. While in the first embodiment, data items ER2, A2, B2, and C2 are correlated with 11, 01, 10, and 00, respectively, they may be differently correlated with, for example, 11, 01, 00, and 10, respectively.

Two-bit data in a memory cell is composed of lower-page data and upper-page data. The lower-page data and upper-page data are written to the memory cell in different write operations, that is, two write operations. When data is represented as XY, X represents upper-page data and Y represents lower-page data.

First, writing lower-page data will be explained with reference to a first to a second stage in FIG. 6. Lower-page data is written on the basis of write data (lower-page data) input from outside the chip. It is assumed that all the memory cells each have threshold voltage distribution ER in an erased state and have stored data item 11. When lower-page data has been written, the threshold voltage distribution ER of the memory cell is divided into two threshold voltage distributions (ER1 and A1), depending on the value (1 or 0) of the lower-page data. When the value of the lower-page data is 1, this gives ER1=ER because the threshold voltage distribution ER in the erased state is maintained. However, ER1>ER is acceptable.

When the value of lower-page data is 0, a high electric field is applied to the tunnel oxide film of the memory cell to inject electrons into the floating gate, thereby raising the threshold voltage Vth of the memory cell by a specific value. Specifically, verify voltage $V_{A1V}$ is set and a write operation is repeated until a threshold voltage greater than or equal to the verify voltage $V_{A1V}$ has been reached. As a result, the memory cell changes into a written state (data item 10). When a specific threshold voltage has not been reached even if a write operation had been repeated a specific number of times (or if the number of memory cells that had not reached a specific threshold voltage is greater than or equal to a specific value), writing to the physical page falls under a program error.

Next, writing upper-page data will be explained with reference to a second and a third stage in FIG. 6. Upper-page data is written on the basis of write data (upper-page data) input from outside the chip and lower-page data already written to the memory cell.

Specifically, when upper-page data is 1, a high electric field is prevented from being applied to the tunnel oxide film of a memory cell, thereby preventing the threshold voltage Vth of the memory cell from rising. As a result, a memory cell with data item 11 (threshold voltage distribution ER1 in the erased state) keeps data item 11 as it is (threshold voltage distribution ER2) and a memory cell with data 10 (threshold voltage distribution A1) keeps data item 10 as it is (threshold voltage distribution B2). However, in terms of securing a voltage margin between individual distributions, it is desirable that the lower limit of a threshold voltage distribution should be adjusted using a higher positive verify voltage $V_{B2V}$ than the verify voltage $V_{A1V}$, thereby forming a threshold voltage distribution B2 whose width has been narrowed by the adjustment. When a specific threshold voltage has not been reached even if the lower limit adjustment had been repeated a specific number of times (or when the number of memory cells that had not reached a specific threshold voltage is greater than or equal to a specific value), writing to the physical page falls under a program error (program failure).

When the value of the upper-page data is 0, a high electric field is applied to the tunnel oxide film of a memory cell to inject electrons into the floating gate, thereby raising the threshold voltage Vth of the memory cell by a specific value. Specifically, verify voltages $V_{A2V}$ and $V_{C2V}$ are set and a write operation is repeated until a threshold voltage greater than or equal to verify voltages $V_{A2V}$ and $V_{C2V}$ has been reached. As a result, a memory cell with data item 11 (threshold voltage distribution ER1 in the erased state) changes to data item 01 of threshold voltage distribution A2 and a memory cell with data item 10 (threshold voltage distribution A1) changes to data item 00 of threshold voltage distribution C2. When a specific threshold voltage has not been reached even if a write operation has been repeated a specific number of times (or when the number of memory cells that have not reached a specific threshold voltage is greater than or equal to a specific value), writing in the physical page falls under a program error.

In an erase operation, an erase verify voltage $V_{ev}$ is set and an erase operation is repeated until a threshold voltage less than or equal to erase verify voltage $V_{ev}$ has been reached. As a result, the memory cell changes to an erase state (data item 11). When the threshold voltage has not dropped to a specific threshold voltage or lower even if an erase operation has been repeated a specific number of times (or when the number of memory cells that have not dropped to a specific threshold voltage or lower is greater than or equal to a specific value), writing in the physical page falls under an erase error.

What has been described above is an example of a data writing method in a general 4-level store method. In a multi-level store method with three bits per cell or more, the basic operation is the same because only the process of dividing a threshold voltage distribution into eight or more pieces is added according to higher-level page data.

[2. Operation of SSD 1]

Next, each operation of the SSD 1 will be explained. First, a boot sequence of the SDD 1 will be explained.

Firmware stored in the firmware area 3a of the NAND flash memory 3 is capable of executing at least a normal mode and an autorun mode, or two modes. The normal mode, which is the mode of performing an operation corresponding to an instruction given by the user or the host device 10, includes a normal read operation, write operation, and erase operation. The autorun mode is the mode of the SSD 1 performing a specific operation automatically without control from outside the SSD 1. The specific operation is determined by autorun-mode firmware.

Figure 7:
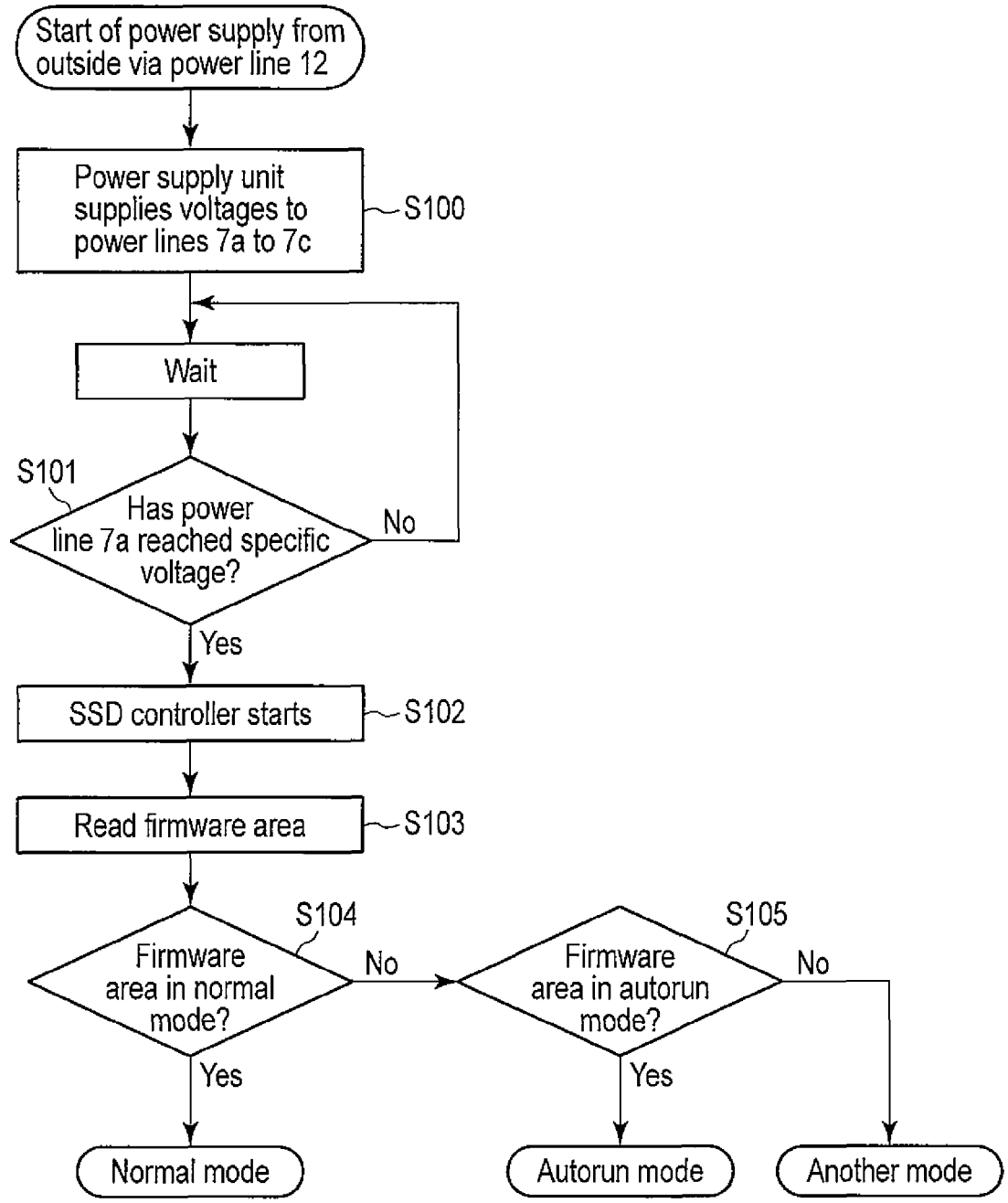
FIG. 7 is a flowchart to explain an SSD boot sequence.

FIG. 7 is a flowchart to explain a boot sequence of the SSD 1. First, an external voltage is externally supplied to the SSD 1 via the power line 12. Then, the power supply unit 5 supplies various voltages to the power lines 7a to 7c (step S100). When the power line 7a has reached a specific voltage (step S101), the SSD controller 2 starts up (step S102).

Next, the SSD controller 2 reads firmware stored in the firmware area 3a of the NAND flash memory 3 (step S103). Then, when the firmware area 3a is in the normal mode (step S104), the SSD controller 2 executes the normal mode on the basis of the firmware from this point on. In addition, when the firmware area 3a is in the autorun mode (step S105), the SSD controller 2 executes the autorun mode on the basis of the firmware from this point on. Moreover, when the firmware area 3a is in a mode other than the normal mode and the autorun mode, the SSD controller 2 executes another mode corresponding to firmware from this point on.

Firmware stored in the firmware area 3a can be rewritten by 92h DOWNLOAD MICROCODE or 93h DOWNLOAD MICROCODE DMA, commands complying with the INCITS ACS-2 written in, for example, non-patent documents
(ATA/ATAPI Command Set-2 (ACS-2) d2015r6, Feb. 22, 2011,
http://www.t13.org/Documents/UploadedDocuments/docs 2011/d2015r6-ATAATAPI_Command_Set_-_2_ACS-2.pdf). Alternatively, it may be rewritten by an SCT command complying with the INCITS ACS-2 or another vendor's unique command. Still alternatively, the firmware stored in the firmware area 3a may be such that common firmware is used in both the normal mode and the autorun mode and switches between the normal mode and autorun mode by rewriting a trigger (a flag) held in a nonvolatile manner in the firmware with an SCT command complying with the INCITS ACS-2 or another vendor's unique command.

Next, a test method (a screening operation) of the first embodiment will be explained. When the autorun mode is started, the SSD controller 2 performs the screening of the NAND flash memory 3 (performs NAND screening). NAND screening is to age (wear out) the NAND flash memory 3, while erasing, programming, and reading blocks repeatedly, to accelerate the reliability of blocks that might cause an initial failure (infant mortality failure). Then, a block where an erase error, a program error, or an uncorrectable error checking and correction (ECC) error (read error) has occurred is caused to fall under a bad block (entered into a bad block management table), thereby preventing blocks that might cause a failure from being used by the user.

Figure 8:
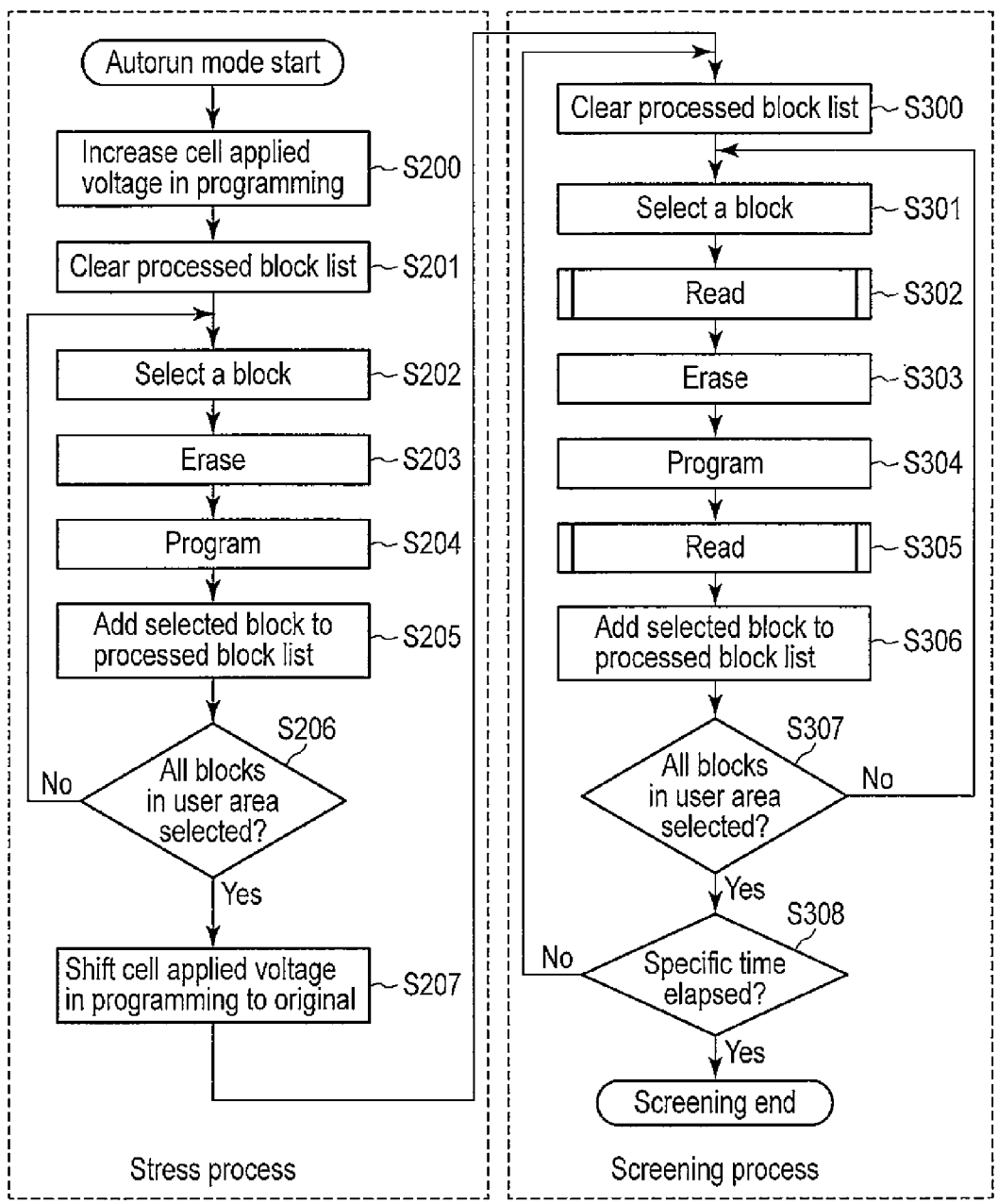
FIG. 8 is a flowchart to explain an SDD screening operation.

FIG. 8 is a flowchart to explain a screening operation of the SDD 1. The screening operation of the first embodiment includes a stress process and a screening process. Specifically, to improve the screening efficiency, a stress process is performed before a screening process.

When the autorun mode is started, the SSD controller 2 increases a voltage to be applied to a memory cell in a program operation included in the stress process (step S200). Specifically, the SSD controller 2 increases a program voltage to be applied to the selected word line (a voltage to be applied between the selected word line and a p-well) in a program operation included in the stress process more than a normal program voltage used in a program operation in the normal mode. A program operation in the normal mode is for the SSD controller 2 to program the NAND flash memory 3 according to a program command from the host device 10. Then, the SSD controller 2 clears a list that manages blocks that have finished the stress process (a processed block list) (step S201). The processed block list has been stored in a RAM in the SSD controller 2.

Then, the SSD controller 2 selects a block from the user area 3C of the NAND flash memory 3 (step S202). When a block is selected, for example, (1) a block with block address=0 may be selected after the autorun mode is started and thereafter blocks may be selected sequentially by repeating "block address+1," or (2) a block address list where block addresses are listed randomly may be created and blocks may be selected randomly by selecting a block at the head of the block address list after the autorun mode is started, and then selecting block addresses in the block address list sequentially by repeating "block address list line number+1."

Next, the SSD controller 2 erases data in the selected block (step S203). Then, the SSD controller 2 programs data to the selected block using the program voltage increased in step S200 (step S204). Data at this time is created by the SSD controller 2. In the program operation, a voltage applied between the word line and source/drain of a memory cell and a voltage applied between the word line and floating gate of the memory cell are increased as compared with those in the normal mode. This intentionally breaks down a memory cell whose insulation between the word line and the source/drain and between the word line and the floating gate is not sufficient, thereby accelerating the reliability of the selected block. In addition, for example, a voltage applied between the selected word line and the unselected word lines is increased, thereby intentionally breaking down an insufficient insulation interlayer insulating film between word lines, which accelerates the reliability of the selected block.

When an erase error has occurred at the time of erasing in step S203, the selected block may be (or may not be) additionally entered into the bad block management table. In addition, when a program error has occurred at the time of programming in step S204, the selected block may (or may not) be additionally entered into the bad block management table.

From the viewpoint of applying stress to a memory cell more reliably, it is desirable that data programmed to a block in the stress process should be data corresponding to C2 of FIG. 6 (C2-level data). On the other hand, from the viewpoint of applying stress to a memory cell uniformly, it is desirable that data programmed to a block should be random numbers. In that case, it is more desirable that data programmed to a block should be random numbers created by the SSD controller 2 in each step or in each loop. Programming is performed on all the pages (including both the lower page and upper page) in the selected block.

It is preferable to apply stress more reliably by increasing the number of program verify operations in a program operation in the stress process more than that in a program operation in the normal mode.

Then, the SSD controller 2 additionally enters the selected block into the processed block list (step S205). Instead of the processed block list in step S201, an unprocessed block list stored in the RAM may be initialized and the selected block may be deleted from the unprocessed block list in step S205. Then, the SSD controller 2 determines whether all the blocks in the user area 3C of the NAND flash memory 3 have been selected (step S206). If all the blocks have not been selected in step S206, control returns to step S202, where the next block is selected.

If all the blocks have been selected in step S206, the SSD controller 2 shifts the program voltage applied to the selected word line in the program operation to the original, specifically, to the program voltage in the normal mode (step S207). This completes the stress process. From the viewpoint of increasing stress applied to a memory cell, it is preferable to repeat steps S201 to S206 or steps S200 to S207 a plurality of times.

Then, control proceeds to a screening process. The SSD controller 2 clears a list (processed block list) that manages blocks subjected to a screening process (step S300). The processed block list is stored in the RAM in the SSD controller 2. Then, the SSD controller 2 selects a block from the user area 3c of the NAND flash memory 3 (step S301). Block selection is the same as in the stress process.

Next, the SSD controller 2 performs reading from the selected block before erasure called pre-read (step S302). Control may proceed to erasing without pre-read in step S302. To increase the detection rate of defects (to improve fault coverage), it is favorable to perform pre-read in step S302. Step S302 is to detect such a defect as destroys data in another block during accessing a certain block. Such a defect includes, for example, a defect in a peripheral circuit of the memory cell array 22 and defective wiring.

For example, data might be written to a block processed in a loop erroneously when another block in the same loop or a subsequent loop is accessed. If pre-read is not performed, a process in the subsequent loop performed on the erroneously written block is started with data erasure and therefore such erroneous reading cannot be detected. If pre-read is performed, such erroneous writing can be detected.

In addition, for example, data might be erased from a block processed in a loop erroneously when another block in the same loop or a subsequent loop is accessed. If pre-read is not performed, a process in the subsequent loop performed on the erroneously erased block is started with data erasure and therefore such erroneous erasure cannot be detected. If pre-read is performed, such erroneous erasure can be detected.

Furthermore, for example, a time interval may be allowed from when data is written to a block until the data is erased and the data is read again by a pre-read operation before erasure, thereby screening blocks with poor data retention as defectives.

In pre-read, for example, the SSD controller 2 reads data sequentially from a page in the selected block and error-corrects the read data using ECC. The SSD controller 2 performs the series of processes on all the pages. For example, when data in each page in the selected block is uncorrectable, or when the number of error-corrected bits is greater than or equal to a specific number X, the block is determined to be defective and is added to bad blocks.

If data is uncorrectable or if the number of error-corrected bits is greater than or equal to the specific number X, the SSD 1 may be regarded as defective and the screening process be terminated immediately. In that case, it is desirable to inform the outside that the screening has ended abnormally and the storage device 1 is defective by terminating the loop and the screening immediately and blinking an LED fast via, for example, a DAS/DSS signal line in the power line 12.

Even when pre-read in step S302 is not performed in FIG. 8, the present invention is effective. Although the effect of the invention can be produced sufficiently even if a pre-read operation is not performed, it is preferable to perform a pre-read operation in the invention from the viewpoint of improving the defect detection rate.

On the other hand, while the stress process improves the fault coverage, the pre-read process enables an erroneous write defect, an erroneous erase defect, and a data retention defect to be detected even if there is no stress process. That is, even if only steps S300 to S308 are executed without the execution of steps S200 to S207 in FIG. 8, the pre-read process S302 enables an erroneous write defect, an erroneous erase defect, and a data retention defect to be detected.

Next, the SSD controller 2 erases data in the selected block (step S303). Then, the SSD controller 2 programs data in the selected block (step S304). In step S304, the SSD controller 2 programs both body data and error-correction redundant bits (spare bit for ECC, parity bit) to the selected block. To perform the aging and screening of memory cells uniformly, it is desirable that the body data should be random numbers. It is more desirable that the body data should be random numbers created by the SSD controller 2 in each step or in each loop. Programming is performed on all the pages (including both the lower page and upper page) in the selected block. A block where an erase error has occurred in step S303 and a block where a program error has occurred in step S304 are grouped into a bad block.

Next, the SSD controller 2 reads data in the selected block (step S305). In reading in steps S302 and S305, the body data is error-corrected using error-correction redundant bits. When the number of error-corrected bits has exceeded a specific number, the reading of the selected block is a read error and the selected block is caused to fall under a bad block. From the viewpoint of causing a block with low reliability to fall under a bad block more reliably, it is preferable to cause a block where a read error has occurred to fall under a bad block. On the other hand, only a block where either an erase error or a program error has occurred may be caused to fall under a bad block and a block where a read error has occurred may not be caused to fall under a bad block.

Figure 9:
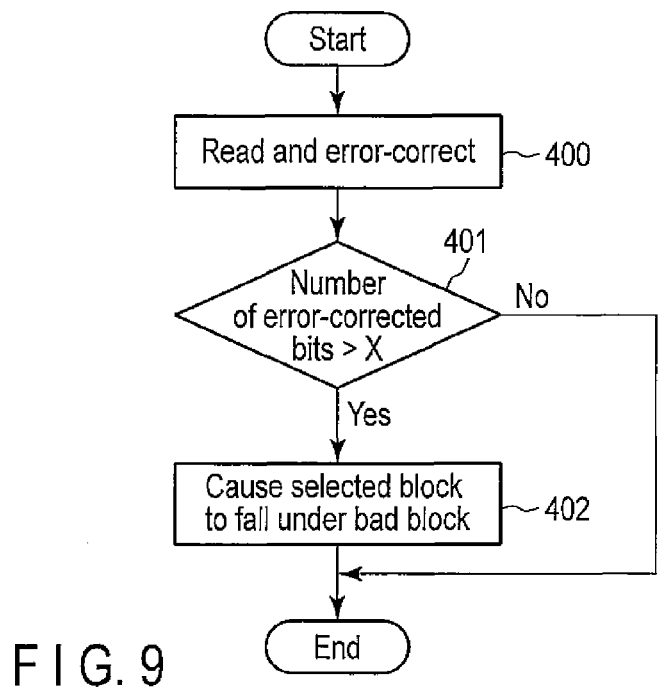
FIG. 9 is a flowchart to explain a read operation at the time of screening.

FIG. 9 is a flowchart to explain a read operation in steps S302 and S305. The SSD controller 2 not only reads data (body data and error-correction redundant bits) from the selected block, but also makes error correction using the error-correction redundant bits (step S400). Then, the SSD controller 2 determines whether the number of error-corrected bits in the selected block has exceeded the specific number X or whether the error correction has failed (step S401).

If the number of error-corrected bits has not exceeded the specific number X in step S401, or if error correction has succeeded, the number of erroneous bits in the selected block is small and therefore the reading process is terminated. In contrast, if the number of error-corrected bits has exceeded the specific number X in step S401, or if error correction has failed, the number of erroneous bits in the selected block is large and therefore the selected block is caused to fall under a bad block (step S402). Specifically, the SSD controller 2 adds the selected block to a bad block management table 3D in the management information area 3B. This prevents the block caused to fall under a bad block from being used in writing data from this point on.

If the number of error-corrected bits is greater than or equal to the specific number X or if there is an uncorrectable block (bad block), the SSD 1 may be regarded as defective. In that case, for example, if the number of error-corrected bits is greater than or equal to the specific number X or if there is an uncorrectable block, it is preferable to inform the outside that the screening has ended abnormally and the SSD 1 is defective by terminating the screening immediately and blinking the LED fast via the DAS/DSS signal line in the power line 12.

If the number of error-corrected bits is greater than or equal to the specific number X or if the number of uncorrectable blocks (bad blocks) is greater than or equal to a specific number, the SSD 1 may be regarded as defective. In addition, when the number of bad blocks in each NAND memory chip 20 is managed, if the number of bad blocks in any one of the NAND memory chips 20 is greater than or equal to the specific number, the SSD 1 may be regarded as defective. Moreover, if the number of bad blocks is greater than or equal to the specific number in a specific number or more of NAND memory chips 20, the SSD 1 may be regarded as defective. Alternatively, if the number of bad blocks is greater than or equal to the specific number in all the NAND memory chips 20, the SSD 1 may be regarded as defective.

In FIG. 8, the SSD controller 2 adds the selected block to the processed block list (step S306). In step S300, the unprocessed block list stored in the RAM may be initialized instead of the processed block list and the selected block may be deleted from the unprocessed block list. Then, the SSD controller 2 determines whether all the blocks in the user area 3C of the NAND flash memory 3 have been selected (step S307). If all the blocks have not been selected in step S307, control returns to step S301, where the next block is selected.

If all the blocks have been selected in step S307, the SSD controller 2 determines whether a specific time has elapsed (step S308). Alternatively, in step S308, whether a specific number of loops has been reached may be determined. If the specific time has not elapsed (or the specific number of loops has not been reached) in step S308, steps S300 to S307 are repeated. If the specific time has elapsed (or the specific number of loops has been reached) in step S308, the screening operation is terminated.

As described above, low-reliability blocks can be screened more efficiently by performing the screening process after accelerating the reliability in the stress process. Then, a block where an erase error, a program error, or an uncorrectable ECC error (UNC error) has occurred in a screening operation is caused to fall under a bad block, thereby preventing a low-reliability block from being used by the user.

Figure 10:
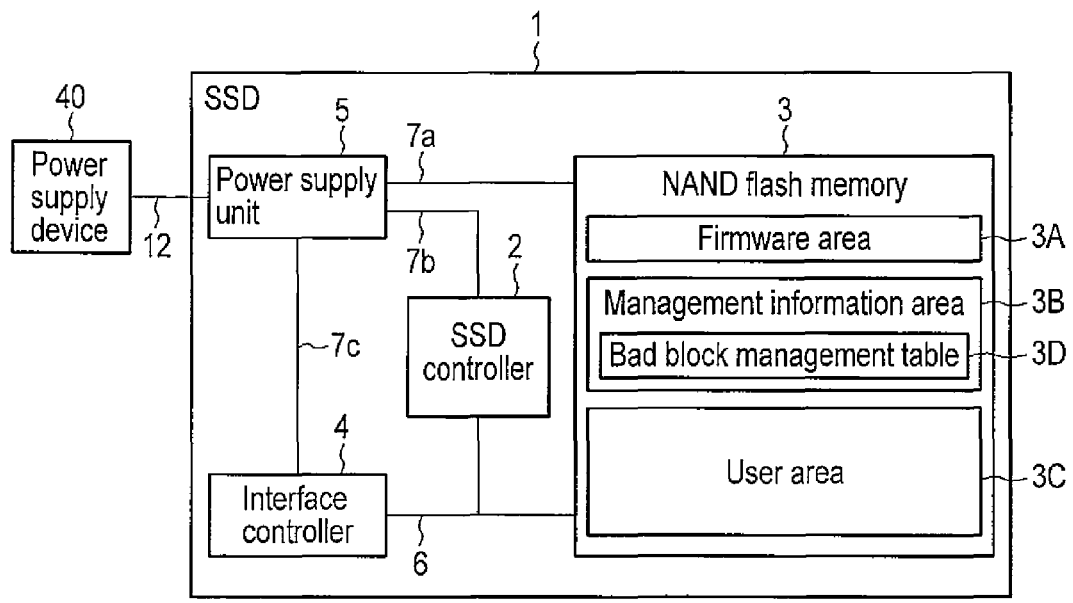
FIG. 10 is a schematic diagram showing the configuration of a screening device.

The host device 10 is not required during NAND screening. In other words, the host device 10 is not required during the Stress process and during the Screening process. Therefore, from the viewpoint of reducing the cost of a NAND screening device, it is desirable that only a power supply device 40 should be connected to the SSD 1 during NAND screening as shown in FIG. 10. Specifically, the SSD 1 is connected to the power supply device 40 via the power line 12. The interface 11 is not connected to the outside. As described above, only the power supply device 40 capable of providing an external power supply for the SSD 1 is prepared, enabling NAND screening to be performed.

In addition, as shown in FIG. 11, it is preferable to screen a plurality of SSDs 1 with the same facility from the viewpoint of improving costs and the throughput of test steps (the processing capability of test steps). A plurality of SSDs 1 are connected to the power supply device 40 via the power line 12. The status of the NAND screening can be detected by the power supply device 40 via the DAS/DSS signal line in the power line 12. The SSDs 1 and the power supply device 40 are put in a thermostatic chamber 41. The thermostatic chamber 41 can set its inside to a specific temperature. Screening a plurality of SSDs 1 at a time with such a device makes it possible to shorten the screening time and reduce the screening cost.

[Effects]

As described above in detail, with the first embodiment, when the power supply unit 5 supplies a voltage, the SSD controller 2 reads firmware from the firmware area 3A of the NAND flash memory 3 and executes the normal mode or the autorun mode on the basis of the firmware. When the firmware is in the normal mode, the SSD controller 2 performs a write operation, a read operation, or an erase operation according to a command from the host device 10. When the firmware is in the autorun mode, the SSD controller 2 performs a screening operation. Specifically, first, the SSD controller 2 writes to the user area 3C using a higher cell applied voltage than in the normal mode, thereby applying stress to the user area 3C. Then, the SSD controller 2 not only repeats erasing, writing, and reading block by block in the user area 3C at a normal-mode voltage, but also corrects error bits at the time of reading. Then, when an erase error has occurred, when a program error has occurred, or when the number of error-corrected bits in the selected block has exceeded the specific value, the selected block is caused to fall under a bad block.

Accordingly, with the first embodiment, greater stress can be applied to a block in the user area 3C in a screening operation than in a normal operation. This enables a low-reliability block to be made defective in the screening operation. Then, a block where a program error, an erase error, or a read error (an uncorrectable ECC error) has occurred is caused to fall under a bad block, thereby preventing a low-reliability block from being used by the user. As a result, the reliability after product shipment can be improved and the failure rate after product shipment can be reduced.

In addition, a write operation is carried out in the stress process, thereby making higher a write voltage in the write operation than the normal-mode voltage. This enables the SSD 1 to be aged (worn out) in a shorter time, making it possible to shorten the test time required to perform screening.

Moreover, in the screening process, reading before erasing called pre-read is performed, thereby causing a block where an uncorrectable ECC error has occurred in the pre-read to fall under a bad block. This makes it possible to detect an error that will possibly destroy data in another block in the course of accessing a block.

[Second Embodiment]

In a second embodiment, to apply greater stress to a memory cell, an erase voltage used in erasing data in a memory cell is increased as compared with in a normal mode. Then, in a stress process included in a screening operation, a memory cell is erased from using the increased erase voltage. FIG. 12 is a flowchart to explain the screening of the SSD 1 of the second embodiment.

When an autorun mode is started, an SSD controller 2 increases a voltage to be applied to a memory cell in an erase operation included in a stress process (step S500). Specifically, the SSD controller 2 increases an erase voltage to be applied to a body (p-well) formed in the memory cell in the erase operation included in the stress process as compared with an erase voltage used in an erase operation in the normal mode. Next, as in the stress process of FIG. 8, the SSD controller 2 clears a processed block list or initializes an unprocessed block list (step S501) and then selects a block (step S502).

Next, the SSD controller 2 erases data in the selected block using the erase voltage increased in step S500 (step S503). In this erase operation, a voltage applied between the word line and the body of the memory cell has been increased as compared with in the normal mode. This causes a memory cell whose insulation between the word line and the body is not sufficient to be broken down by a high voltage intentionally, thereby accelerates the reliability of the selected block.

Next, the SSD controller 2 programs data to the selected block (step S504). Then, the SSD controller 2 adds the selected block to the processed block list or deletes the selected block from the unprocessed block list (step S505). Then, the SSD controller 2 repeats steps S502 to S504 until all the blocks in the user area 3C have been selected (step S506). In the second embodiment, the purpose is to apply stress using the increased erase voltage and therefore the program in step S504 may not be executed.

When all the blocks have been selected in step S506, the SSD controller 2 shifts the erase voltage to be applied to the body in an erase operation to the original. That is, the SSD controller 2 shifts the erase voltage to that in the normal mode (step S507). This completes the stress process. Thereafter, a screening process is carried out as in FIG. 8.

If an erase error has occurred in erasing in step S503, the selected block may (or may not) be added as a bad block to a bad block management table. In addition, if a program error has occurred in programming in step S504, the selected block may (or may not) be added as a bad block to the bad block management table.

As described above, after the reliability is accelerated in the stress process, the screening step is carried out, enabling a low-reliability block to be screened efficiently. Then, a block where an uncorrectable ECC error has occurred in the screening operation is caused to fall under a bad block, preventing a low-reliability block from being used by the user.

Figure 13:
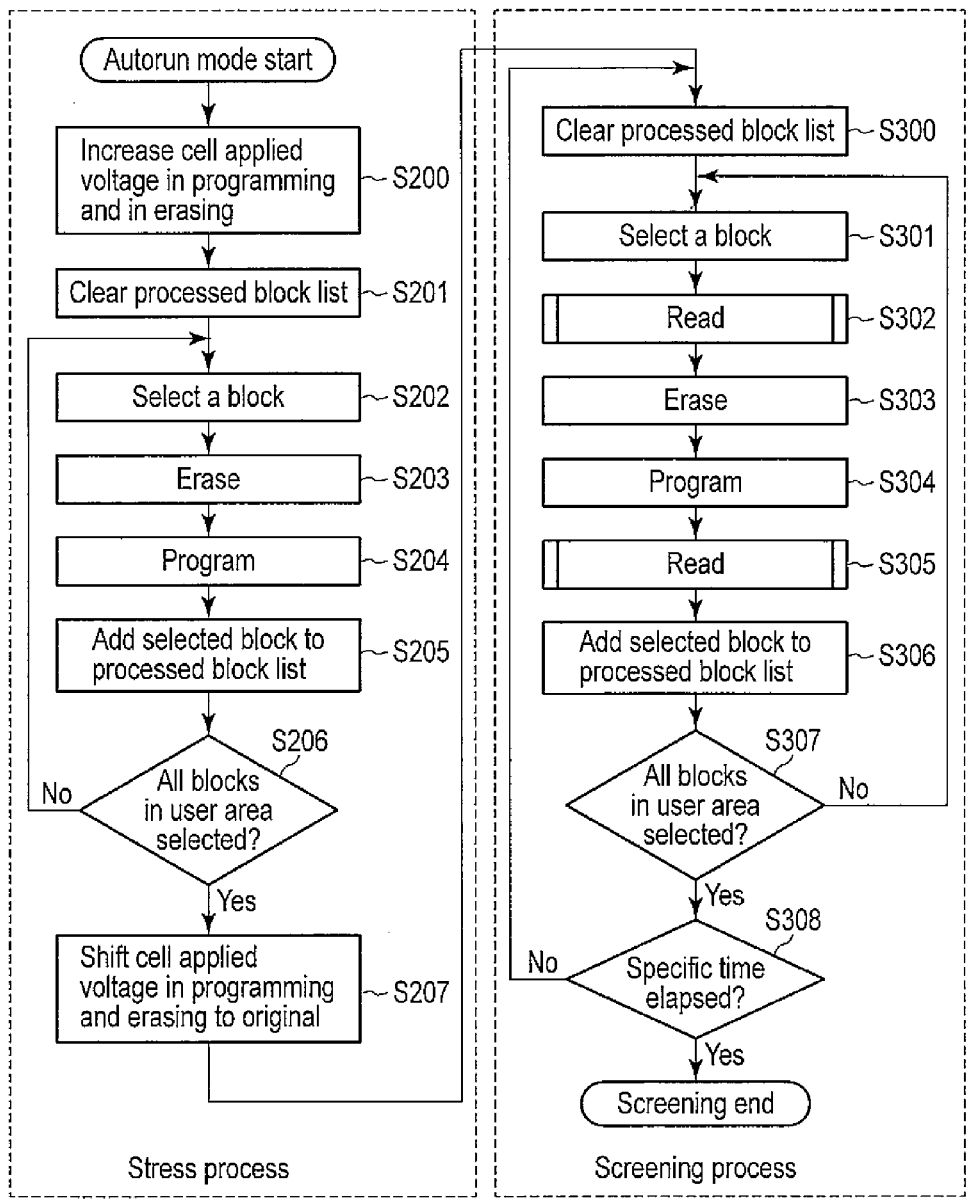
FIG. 13 is a flowchart to explain an SSD screening operation according to a modification.

The second embodiment may be combined with the first embodiment. FIG. 13 is a flowchart to explain the screening of the SSD 1 according to a modification.

When the autorun mode is started, the SSD controller 2 not only increases a voltage to be applied to a memory cell in a program operation, but also increases a voltage to be applied to the memory cell in an erase operation (step S200). Specifically, the SSD controller 2 increases a program voltage to be applied to the selected word line in a program operation as compared with a program voltage used in a program operation in the normal mode. In addition, the SSD controller 2 increases an erase operation to be applied to the body (p-well) formed in a memory cell in an erase operation as compared with an erase voltage used in an erase operation in the normal mode.

Then, the SSD controller 2 not only erases data in the selected block using the erase voltage increased in step S200 (step S203), but also programs data in the selected block using the program voltage increased in step S200 (step S204).

This makes it possible to apply greater stress to the selected block, accelerating the reliability of the selected block.

[Third Embodiment]

Figure 14:
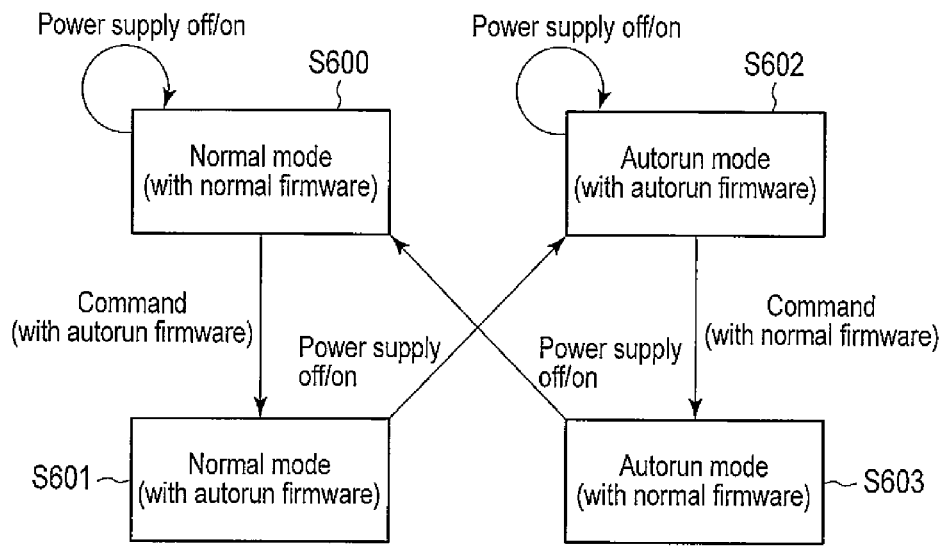
FIG. 14 is a state transition diagram to explain the operation of switching between a normal mode and an autorun mode according to a third embodiment.

A third embodiment relates to a method of switching between a normal mode and an autorun mode. FIG. 14 is a state transition diagram to explain the operation of switching between the normal mode and the autorun mode according to the third embodiment.

Two types of firmware, normal firmware and autorun firmware, are prepared as means for switching the normal mode and the autorun mode.

The rewriting of firmware can be performed using a command defined in an interface supported by the SSD 1.

For example, as described above, a download microcode command (92h DOWNLOAD MICROCODE or 93h DOWNLOAD MICROCODE DMA) complying with the ACS-2 is used. Normal-mode firmware and autorun-mode firmware have been stored in, for example, a server connected to the Internet. A tester device is connected to the server through the Internet so that the tester device can communicate with the server. Firmware is downloaded to the tester device through the Internet connection. The tester device writes the firmware to a firmware area 3A of the SSD 1 using the command via the interface 11.

Alternatively, the normal-mode and autorun-mode firmware may be stored on an optical medium, such as a DVD-ROM, or in a nonvolatile storage medium, such as a USB memory. The tester device is connected to the storage medium. The tester device writes the firmware to the firmware area 3A of the SSD 1 using the command via the interface 11.

Step S600 is in a state where the SSD 1 is in the normal mode and the normal firmware has been written to the firmware area 3A of the NAND flash memory 3. In the state of step S600, when the power supply of the SSD 1 is changed from off to on, the SSD 1 executes the normal firmware written to the firmware area 3A and goes into the normal mode.

For example, when the tester device has written the autorun firmware to the SSD 1 using an ATA download microcode command, the SSD 1 proceeds from step S600 to step S601. That is, the SSD 1 is in the normal mode and the autorun firmware has been written to the firmware area 3A. In the state of step S601, when the power supply of the SSD 1 is changed from off to on, the SSD 1 proceeds from step S601 to step S602, executes the autorun firmware written to the firmware area 3A, and goes into the autorun mode. In the state of step S602, the SSD 1 executes the aforementioned screening operation. In addition, in the state of step S602, when the power supply of the SSD 1 is changed from off to on, the SSD 1 executes the autorun firmware written to the firmware area 3A and goes into the autorun mode.

After the screening has completed, when the tester device writes the normal firmware to the SSD 1 by using a download microcode command, the SSD 1 proceeds from step S602 to step S603. That is, the SSD 1 is in the autorun mode and the normal firmware has been written to the firmware area 3A. In the state of step S603, when the power supply of the SSD 1 is changed from off to on, the SSD 1 transits from step S603 to step S600, executes the normal firmware written to the firmware area 3A, and goes into the normal mode.

The tester device has a configuration equivalent to that of the host device 10 of FIG. 1 and a connection configuration equivalent to that of the storage device 1. The tester device is used for preprocessing before screening and for a test process after screening. Before screening, the storage device 1 and the tester device 10 are connected to each other with the power line 12 and interface 11 as shown in FIG. 1. Then, the firmware area 3A is rewritten (the transition from state S600 to state S601), thereby disconnecting the power line 12 and interface 11 from the storage device 1 and tester device 10 and connecting the storage device 1 and the power supply device 40 to each other with the power line 12. This causes the storage device 1 to go into state S602. Then, screening is started. After the screening is completed, the power line 12 between the storage device 1 and power supply device 40 is disconnected and the storage device 1 and the tester device 10 are connected to each other with the power line 12 and interface 11. Then, the firmware area 3A is rewritten (the transition from state S602 to state S603), thereby connecting the power line 12 again after the power line 12 is disconnected, with the result that the state finally transits to S600.

Although the state transition from S601 to S602 or from S603 to S600 does not take place unless the power supply is turned off and on after the firmware area 2F is rewritten using a download microcode command, the state transition of S600→S601→S602 or of S602→S603→S600 may take place immediately after a download microcode command has been received.

As described above in detail, with the third embodiment, it is possible to switch between the normal mode and the autorun mode of SDD1 using a command from the outside. This makes it possible to switch between the normal mode and the autorun mode easily and reliably.

[Fourth Embodiment]

Figure 15:
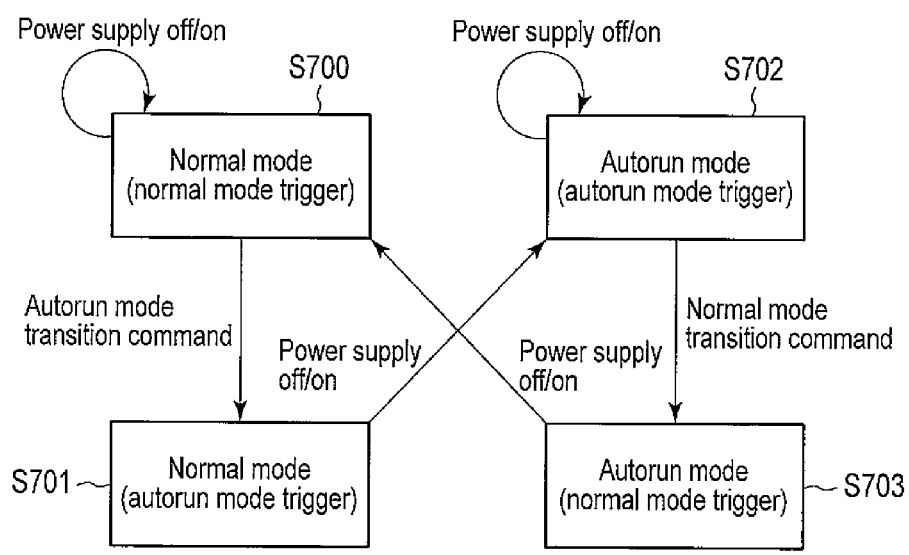
FIG. 15 is a state transition diagram to explain the operation of switching between a normal mode and an autorun mode according to a fourth embodiment.

In a fourth embodiment, only one piece of normal firmware capable of activating both a normal mode and an autorun mode is used and a mode to be executed in the normal firmware is configured to be selected using a command as a trigger. FIG. 15 is a state transition diagram to explain the operation of switching between the normal mode and the autorun mode according to the fourth embodiment.

In the fourth embodiment, a piece of normal firmware capable of executing both the normal mode and the autorun mode is prepared as means for switching between the normal mode and the autorun mode. An ATA command (for example, an SCT command complying with the ACS2 or a vendor-unique command) issued from a tester device is used as a trigger to determine whether to execute either the normal mode or the autorun mode in the normal firmware.

Step S700 is in the initial setting state where the normal firmware has been written to the firmware area 3A of the NAND flash memory 3, the SSD 1 is in the normal mode, and the normal mode has been triggered. In the state of step 700, when the power supply of the SSD 1 is changed from off to on, the SSD 1 goes into the triggered normal mode.

When the tester device has transmitted a command for triggering the autorun mode (an autorun mode transition command) to the SSD 1, the SSD 1 transits from step S700 to step S701. That is, the SDD 1 is in the normal mode and the autorun mode has been triggered. In the state of step S701, when the power supply of the SSD 1 is changed from off to on, the SSD 1 transits from step S701 to step S702, executes the triggered autorun mode in the normal firmware, and transits to the autorun mode. In the state of step S702, the SSD 1 executes the aforementioned screening operation. In addition, in the state of step S702, when the power supply of the SSD 1 is changed from off to on, the SSD 1 remains in the autorun mode because the autorun mode in the normal firmware has been triggered.

After the screening has been completed, when the tester device has transmitted a command for triggering the normal mode (a normal mode transition command) to the SSD 1, the SSD 1 transits from step S702 to step 703. That is, the SSD 1 is in the autorun mode and the normal mode has been triggered. In the state of step S703, when the power supply of the SSD 1 is changed from off to on, the SSD 1 transits from step 703 to step 700, executes the triggered normal mode in the normal firmware, and transits to the normal mode.

The tester device has a configuration equivalent to that of the host device 10 of FIG. 1 and a connection configuration equivalent to that of the storage device 1. The tester device is used for preprocessing before screening and for a test process after screening. Before screening, the storage device 1 and the tester device 10 are connected to each other with the power line 12 and interface 11 as shown in FIG. 1. Then, the tester device issues a command to transit from state S700 to state S701, thereby disconnecting the power line 12 and interface 11 from the storage device 1 and tester device 10 and connecting the storage device and the power supply device 40 to each other with the power line 12. This causes the storage device 1 to go into state S702. Then, screening is started. After the screening is completed, the power line 12 between the storage device 1 and power supply device 40 is disconnected and the storage device 1 and the tester device 10 are connected to each other with the power line 12 and interface 11. Then, the tester device issues a command to transit from state S702 to state S703, thereby connecting the power line 12 again after the power line 12 is disconnected, with the result that the state finally transits to S700.

Although the state transition from S701 to S702 or from S703 to S700 does not take place unless the power supply is turned off and on after the state transition command is issued, the state transition of 700→S701→S702 or of S702→S703→S700 may take place immediately after the state transition command has been received.

The state transition from S702 to S703 may occur automatically. For example, the SSD controller 2 may change the state from S702 to S703 automatically without the transition command when the screening process ends.

As described above in detail, with the fourth embodiment, it is possible to switch between the normal mode and the autorun mode of SDD1 using a command from the outside. This makes it possible to switch between the normal mode and the autorun mode easily and reliably.

In addition, it is possible to switch between the normal mode and the autorun mode by use of only one piece of firmware. Therefore, when a product is shipped after screening, there is no need to rewrite firmware.

[Fifth Embodiment]

From the viewpoint of performing a stress process efficiently, it is preferable to apply not only the aforementioned voltage stress but also thermal stress. Therefore, in a fifth embodiment, after thermal stress is applied to the SSD 1, an autorun mode is executed.

Figure 16:
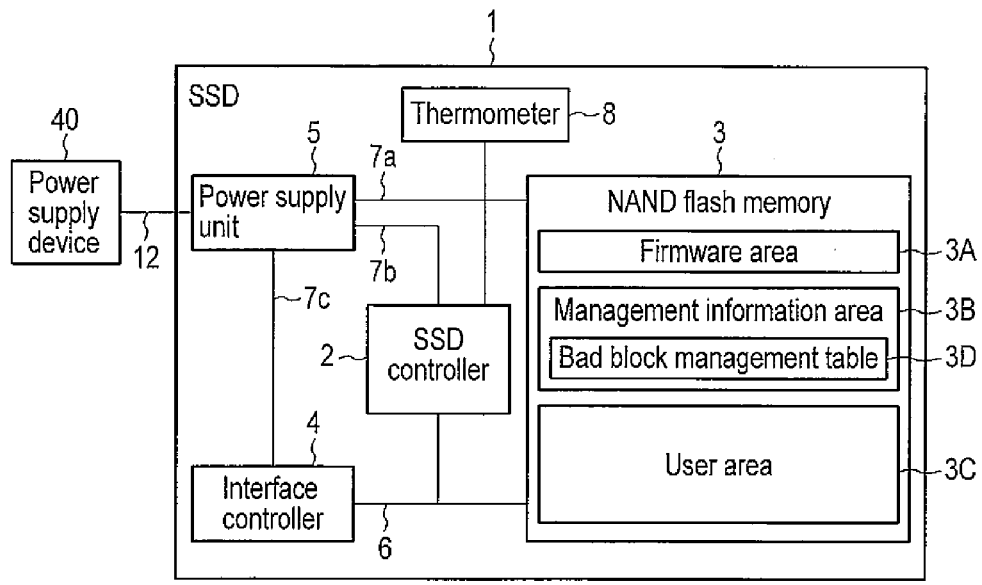
FIG. 16 is a block diagram showing the configuration of an SSD according to a fifth embodiment.

FIG. 16 is a block diagram showing a configuration of the SSD 1 according to the fifth embodiment. The SSD 1 is such that a thermometer 8 is added to the configuration of FIG. 1. An SSD controller 2, which monitors a temperature measured by the thermometer 8, can sense an internal temperature of the SSD 1.

Figure 17:
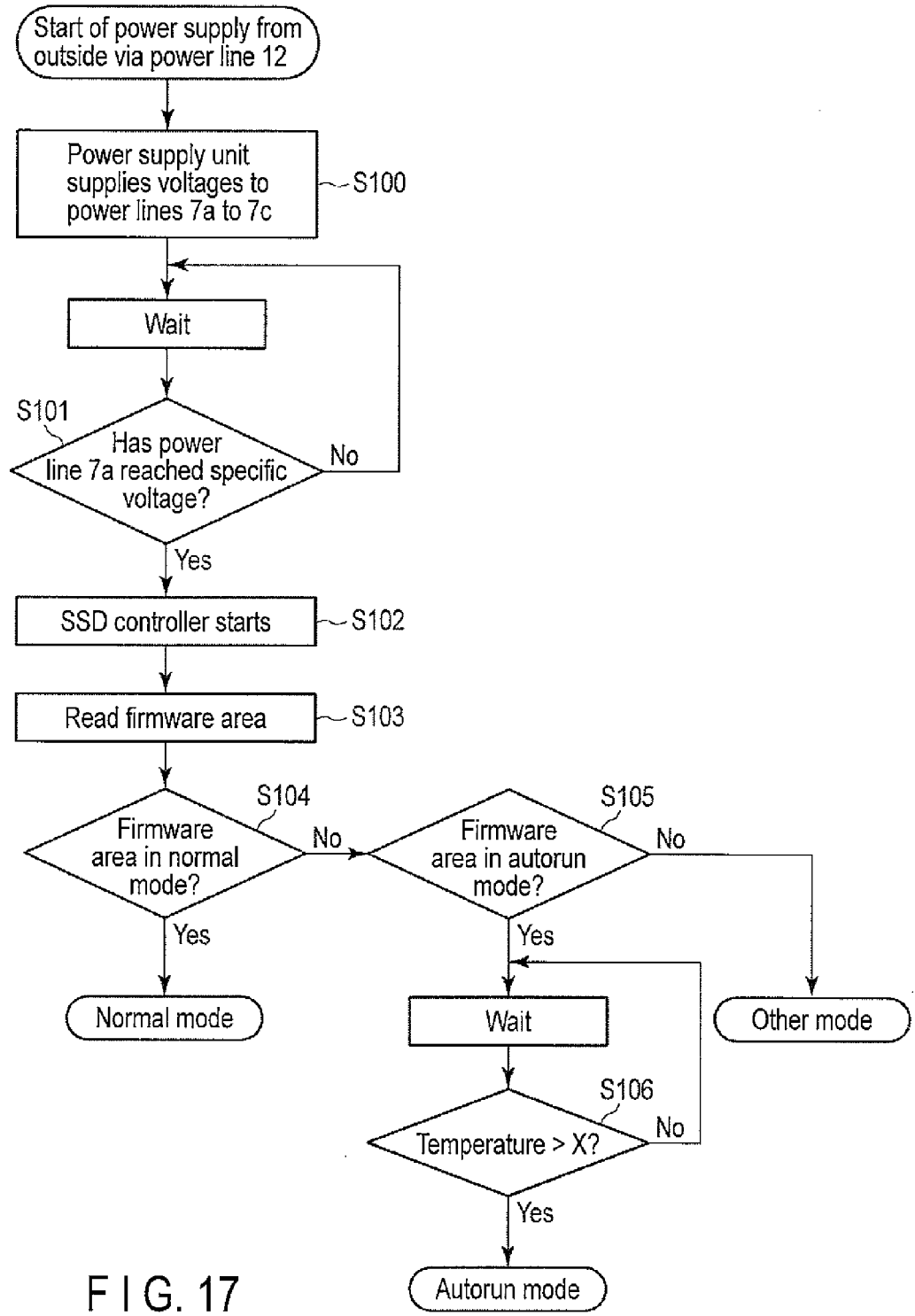
FIG. 17 is a flowchart to explain an SDD boot sequence.

FIG. 17 is a flowchart to explain a boot sequence of the SSD 1. As in FIG. 11, the SSD 1 is connected with a power supply device 40 and placed in a thermostatic chamber 41. That is, in the fifth embodiment, the SSD 1 executes the autorun mode in the thermostatic chamber 41.

Steps S100 to S105 in FIG. 17 are the same as in FIG. 7. Then, when a firmware area 3a is in the autorun mode (step S105), the SSD controller 2 determines a temperature measured by the thermometer 8. Then, when the temperature of the thermometer 8 has exceeded a specific temperature TX, the SSD controller 2 executes the autorun mode (step S106).

As described in detail, with the fifth embodiment, the SSD controller 2 periodically monitors an internal temperature of the SSD 1 and can execute the autorun mode after a target temperature at which the autorun mode (specifically, a stress process) is to be executed has been reached. This makes it possible to carry out a stress process constantly at a specific temperature or higher without being influenced by the effect of the heating efficiency of the thermostatic chamber 41.

[Sixth Embodiment]

Figures 18A, 18B:
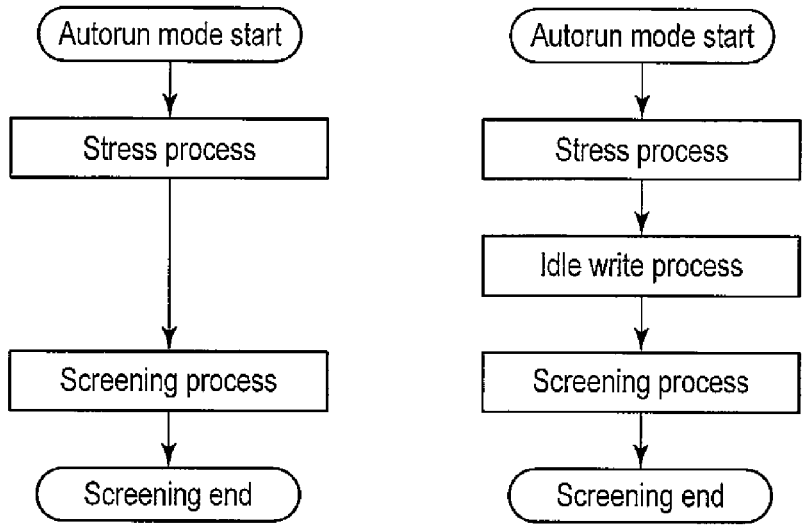
FIGS. 18A and 18B are flowcharts to explain an SSD operation including an idle write process.

In the first and second embodiments, the test method of performing the screening process after the stress process has been explained (FIG. 18A).

In the stress process, a voltage higher than in a normal operation is applied to a memory cell and therefore the operation of a NAND memory cell might become unstable temporarily. For example, when a write operation is executed on a memory cell immediately after a stress process, the occurrence rate of program errors might become higher temporarily. For example, when an erase operation is executed on a memory cell immediately after a stress process, the occurrence rate of erase errors might become higher temporarily. For example, when a read operation is executed on a memory cell immediately after a stress process, the occurrence rate of uncorrectable ECC errors might become higher temporarily. For example, when a write operation is executed on a memory cell immediately after a stress process, a threshold distribution of the memory cell is more liable to fluctuate. Therefore, even if the lower limit of a threshold voltage distribution in a write operation is adjusted a specific number of times, the lower limit might not reach a specific voltage, resulting in a program error. In addition, for example, when a write operation is executed on a memory cell immediately after a stress process, a threshold distribution of the memory cell is more liable to fluctuate. Therefore, when a read operation is executed on the memory cell, the occurrence rate of uncorrectable ECC errors might become higher temporarily.

On the other hand, while an erase operation and write operation are repeatedly executed on a memory cell immediately after a stress process, its operation may become stable and the occurrence rate of errors decrease. If the memory cell is caused to fall under a bad block immediately when an error has occurred in a screening process, a block that need not be caused to fall under a bad block will be excessively caused to fall under a bad block since the probability that such a memory cell will become defective after shipment is low. In other words, blocks may be overkilled by the screening process immediately after the stress process. This is not favorable from the viewpoint of improvements in the test process yield.

In the sixth embodiment, the process of erasing and writing data from and to blocks repeatedly and, even if an erase error or a program error has occurred in a block, not causing the block to fall under a bad block (an idle write process) is inserted between the stress process and the screening process (FIG. 18B), thereby preventing the block from being excessively caused to fall under a bad block (from being overkilled). Unlike the stress process, the idle write process is performed using a normal cell applied voltage.

Figure 19:
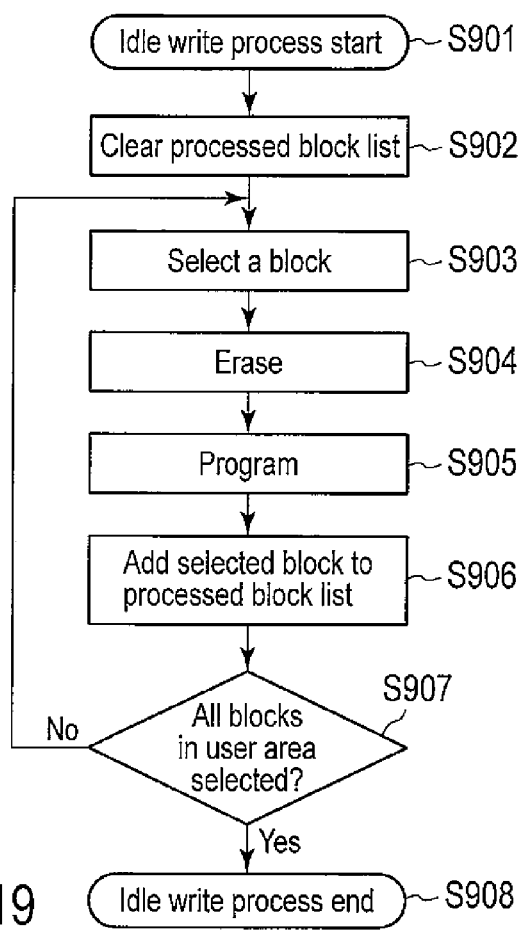
FIG. 19 is a flowchart to explain an idle write process.

FIG. 19 is a flowchart to explain an idle write process. When an idle write process is started (step S901), the SSD controller 2 clears a list that manages blocks subjected to an idle write process (a processed block list) (step S902). The processed block list has been stored in a RAM in the SSD controller 2.

Next, the SSD controller 2 selects one block from the user area 3C of the NAND flash memory 3 (step S903). When a block is selected, for example, (1) a block with block address=0 may be selected after an idle write process is started and thereafter blocks may be selected sequentially by repeating "block address+1," or (2) a block address list where block addresses are listed randomly may be created and blocks may be selected randomly by selecting a block at the head of the block address list after the idle write process is started, and then selecting block addresses in the block address list sequentially by repeating "block address list line number+1."

Next, the SSD controller 2 erases data in the selected block (step S904). Even if an erase error has occurred in the erase operation, the SSD controller 2 does not add the selected block as a bad block to a bad block management table.

Next, the SSD controller 2 programs data in the selected block (step S905). Data at this time is created by the SSD controller 2. Data written to the memory cell may be random data or C2-level data in FIG. 6 may be written to all the memory cells. Even if a program error has occurred in the program operation, the SSD controller 2 does not add the selected block as a bad block to the bad block management table. Programming is performed on all the pages (including the lower page and the upper page) in the selected block.

Next, the SSD controller 2 adds the selected block to the processed block list (step S906). In step 902, instead of the processed block list, the unprocessed block list stored in the RAM may be initialized and the selected block may be deleted from the unprocessed block list in step S906. Then, the SSD controller 2 determines whether all the blocks in the user area 3C of the NAND flash memory 3 have been selected (step S907). If all the blocks have not been selected in step S907, control returns to step S903, where the next block is selected.

If all the blocks have been selected in step S907, the idle write process is terminated (step 908). From the viewpoint of making the memory cell more stable in the screening process, it is preferable to repeat steps S902 to S907 a plurality of times.

Although it is favorable not to cause the selected block to fall under a bad block even if an error has occurred in both the erase operation in step S904 and the program operation in step S905, the selected block may be caused to fall under a bad block when an erase error has occurred in the erase operation in step S904 while the selected block should not be caused to fall under a bad block when a program error has occurred in the program operation in step S905.

As described above, the idle write process is performed between the stress process and the screening process, making the operation of the memory cell stable, which suppresses the act of unnecessarily (or excessively) causing normal blocks to fall under bad blocks. In other words, the idle write process prevents the screening process from overkilling normal blocks.

Figure 20:
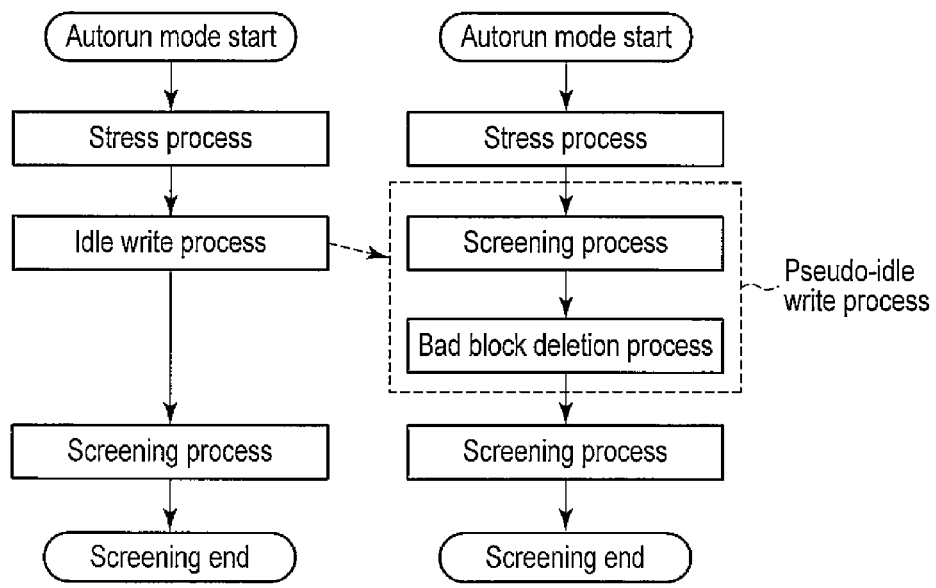
FIG. 20 is a flowchart to explain a SSD operation including a pseudo-idle write process.

Instead of the idle write process in FIG. 18B, a screening process and the process of deleting bad blocks occurred in the screening process (a bad block deleting process) are performed, which produces a similar effect (FIG. 20). The screening process and the bad block deleting process are referred to as a pseudo-idle write process.

Figure 21:
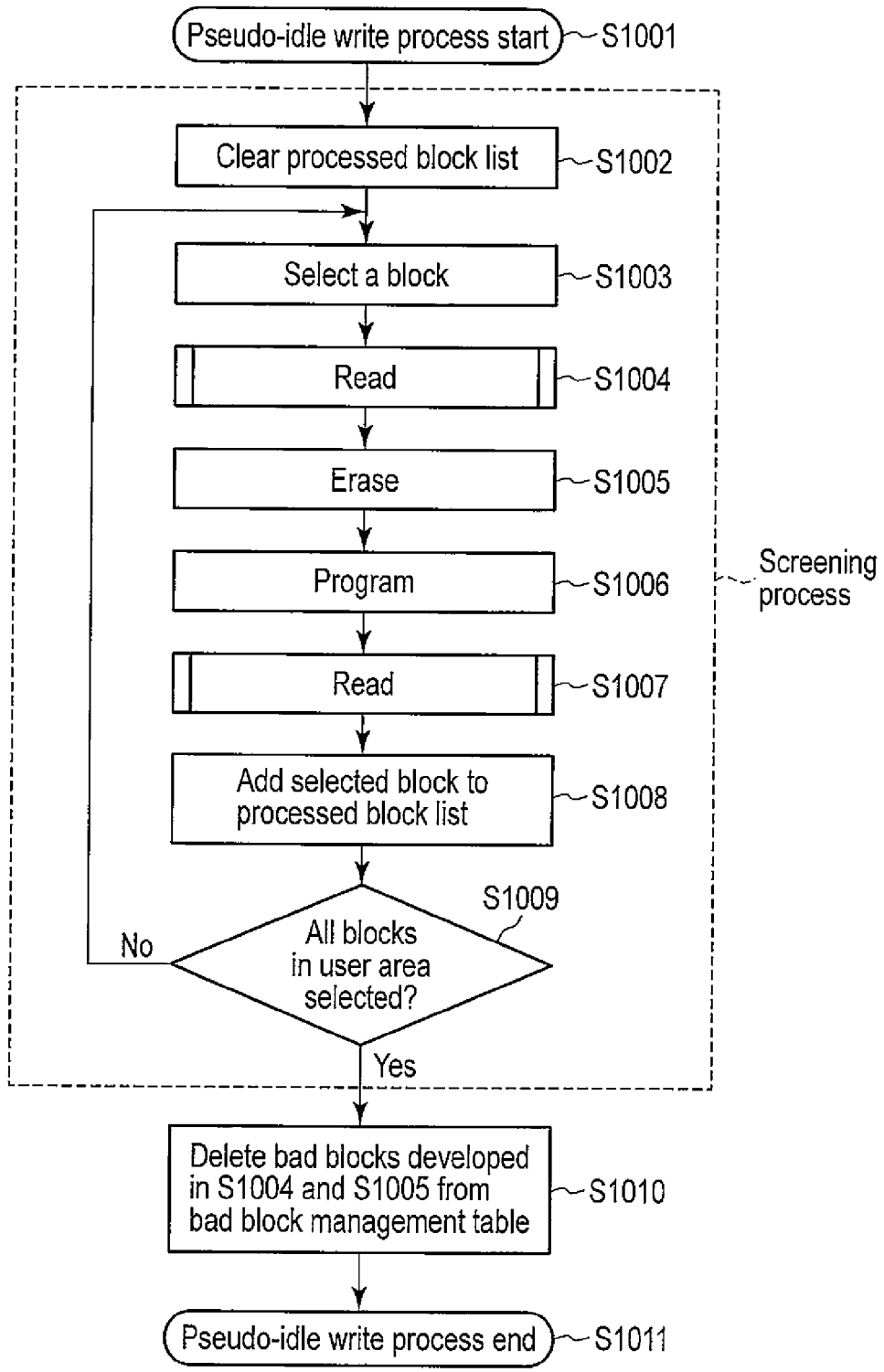
FIG. 21 is a flowchart to explain a pseudo-idle write process.

FIG. 21 is a flowchart to explain a pseudo-idle write process. When a pseudo-idle write process is started (step S1001), the SSD controller 2 performs a screening process (steps S1002 to S1009). The screening process (steps S1002 to S1009) is the same as the screening process (steps S300 to S307 in FIG. 8) in the first embodiment. The SSD controller 2 deletes bad blocks occurred in steps S1004 and S1005 from the bad block management table (step S1010). Thereafter, the pseudo-idle write process is terminated (step S1011).

Even when an uncorrectable ECC error has occurred during the pseudo-idle write process, the SSD need not be determined to be defective because the operation of the memory cell may be unstable temporarily. In this case, even if a block is normal, it is entered into the bad block management table temporarily. Thereafter, however, the block is recognized again as being normal by being deleted from the bad block management table in a bad block deleting process (step S1011).

The pseudo-idle write process increases the number of processes as compared with the idle write process (FIG. 18B). However, the pseudo-idle write process can use the same process as a normal screening process again as the process of accessing memory cells and therefore there is a possibility that implementation will become relatively simple. From the viewpoints of not unnecessarily increasing the number of times a block is erased from and of reducing test time, it is desirable that the number of times steps S1002 to S1009 in a screening process in a pseudo-idle write process are repeated should be smaller than the number of times a normal screening process (for example, steps S300 to S307) is repeated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a nonvolatile semiconductor memory,
a power supply unit;
a controller; and
a nonvolatile semiconductor memory comprising a memory cell array including blocks each including memory cells, wherein
the memory cell array comprises:
a firmware area to store firmware used to execute either a normal mode in which the controller performs an operation corresponding to an instruction from a host device or an autorun test mode in which the controller conducts a specific test, regardless of an instruction from the host device, and
a user area to store user data,
the power supply unit configured to receive a power supply from outside the semiconductor storage device and to supply a specific voltage to the nonvolatile semiconductor memory and the controller,
the controller:
reads the firmware from the nonvolatile semiconductor memory,
determines whether the firmware has been set in either the normal mode or the autorun test mode when having received a voltage from the power supply unit, and
performs a first process and a second process in that order when the firmware has been set in the autorun test mode, wherein
the first process includes writing data to a block in the user area using a first cell applied voltage higher than a voltage used in the normal mode,
the first process includes erasing data from the block in the user area using a second cell applied voltage before the writing data to the block in the user area using the first cell applied voltage, the second process includes repeating performing erasing data, writing data, and first reading data in that order in each block in the user area, a third cell applied voltage, which is used in the normal mode, is lower than the first cell applied voltage and is used in the writing of the second process, and a fourth cell applied voltage, which is used in the erasing data of the second process, is lower than the second cell applied voltage.

2. The device of claim 1, wherein the second process includes performing second reading data before the erasing data of the second process.

3. The device of claim 2, wherein:
the controller conducts at least two loops of performing the second reading data, erasing data, writing data, and the first reading data in that order in each block of the user area in the second process,
the second reading data in a second or later loop is performed before data in the writing data in a loop before the second or later loop is erased, and
the first reading data in the second and later loops is performed on data newly written after data in the writing data in the loop before the second or later loop is erased.

4. The device of claim 1, wherein:
the first process includes not entering a block where an error has occurred as a bad block when the error has occurred in the writing data to the block in the user area using the first cell applied voltage, and
the second process includes entering a block where an error has occurred as a bad block when the error has occurred in the erasing data from the block in the user area or when the error has occurred in the writing data to the block in the user area.

5. The device of claim 1, wherein the controller performs a third process which includes repeating performing erasing data and writing data in each block in the user area using the third cell applied voltage when the firmware has been set in the autorun test mode after the first process before the second process.

6. The device of claim 2, wherein:
the controller enters a block where an error has occurred as a bad block when the error has occurred in the first reading data and the second reading data.

7. The device of claim 1, wherein:
the controller
determines whether a temperature has exceeded a specific value when having received a voltage from the power supply unit, and
performs the first process and the second process in that order when the temperature has exceeded the specific value.

8. A method of testing a nonvolatile semiconductor memory comprising a memory cell array that includes blocks each including memory cells, the memory cell array including a firmware area to store firmware used to execute either a normal mode in which an operation corresponding to an instruction from a host device is performed or an autorun test mode in which a specific test is conducted, regardless of an instruction from the host device, the method comprising:
reading the firmware from the nonvolatile semiconductor memory and determining whether the firmware has been set in either the normal mode or the autorun test mode; and
performing a first process and a second process in that order when the firmware has been set in the autorun test mode, wherein the first process includes writing data to a block in the user area using a first cell applied voltage higher than a voltage used in the normal mode,
the first process includes erasing data from the block in the user area using a second cell applied voltage before the writing data to the block in the user area using the first cell applied voltage,
the second process includes repeating performing erasing data, writing data, and first reading data in that order in each block in the user area,
a third cell applied voltage, which is used in the normal mode, is lower than the first cell applied voltage and is used in the writing of the second process, and
a fourth cell applied voltage, which is used in the erasing data of the second process, is lower than the second cell applied voltage.

9. The method of claim 8, wherein the second process includes performing second reading data before the erasing data of the second process.

10. The method of claim 9, wherein:
the second process includes conducting at least two loops of performing the second reading data, erasing data, writing data, and the first reading data in that order in each block of the user area,
the second reading data in a second or later loop is performed before data in the writing data in a loop before the second or later loop is erased, and
the first reading data in the second and later loops is performed on data newly written after data in the writing data in the loop before the second or later loop is erased.

11. The method of claim 8, wherein:
the first process includes not entering a block where an error has occurred as a bad block when the error has occurred in the writing data to the block in the user area using the first cell applied voltage, and
the second process includes entering a block where an error has occurred as a bad block when the error has occurred in the erasing data from the block in the user area or when the error has occurred in the writing data to the block in the user area.

12. The method of claim 8, further comprising:
performing a third process which includes repeating performing erasing data and writing data in each block in the user area using the third cell applied voltage when the firmware has been set in the autorun test mode after the first process before the second process.

13. The method of claim 9, wherein the second process includes entering a block where an error has occurred as a bad block when the error has occurred in the first reading data and the second reading data.

14. The method of claim 8, further comprising:
determining whether a temperature has exceeded a specific value when having received a voltage from a power supply unit; and
performing the first process and the second process in that order when the temperature has exceeded the specific value.

15. A non-transitory computer-readable medium having stored thereon a program for testing a nonvolatile semiconductor memory which comprises a memory cell array that includes blocks each including memory cells, the memory cell array including a firmware area to store firmware used to execute either a normal mode in which an operation corresponding to an instruction from a host device is performed or an autorun test mode in which a specific test is conducted, regardless of an instruction from the host device, the program controlling a controller for controlling the nonvolatile semiconductor memory to execute functions of:
- reading the firmware from the nonvolatile semiconductor memory and determining whether the firmware has been set in either the normal mode or the autorun test mode; and
- performing a first process and a second process in that order when the firmware has been set in the autorun test mode, wherein
- the first process includes writing data to a block in the user area using a first cell applied voltage higher than a voltage used in the normal mode,
- the first process includes erasing data from the block in the user area using a second cell applied voltage before the writing data to the block in the user area using the first cell applied voltage,
- the second process includes repeating performing erasing data, writing data, and first reading data in that order in each block in the user area,
- a third cell applied voltage, which is used in the normal mode, is lower than the first cell applied voltage and is used in the writing of the second process, and
- a fourth cell applied voltage, which is used in the erasing data of the second process, is lower than the second cell applied voltage.

16. The medium of claim 15, wherein the second process includes performing second reading data before the erasing data of the second process.

17. The medium of claim 16, wherein:
- the second process includes conducting at least two loops of performing the second reading data, erasing data, writing data, and the first reading data in that order in each block of the user area,
- the second reading data in a second or later loop is performed before data in the writing data in a loop before the second or later loop is erased, and
- the first reading data in the second and later loops is performed on data newly written after data in the writing data in the loop before the second or later loop is erased.

18. The medium of claim 15, wherein:
- the first process includes not entering a block where an error has occurred as a bad block when the error has occurred in the writing data to the block in the user area using the first cell applied voltage, and
- the second process includes entering a block where an error has occurred as a bad block when the error has occurred in the erasing data from the block in the user area or when the error has occurred in the writing data to the block in the user area.

19. The medium of claim 15, further comprising:
- performing a third process which includes repeating performing erasing data and writing data in each block in the user area using the third cell applied voltage when the firmware has been set in the autorun test mode after the first process before the second process.

20. The medium of claim 16, wherein the second process includes
- entering a block where an error has occurred as a bad block when the error has occurred in the first reading data and the second reading data.

21. The medium of claim 15, further comprising:
- determining whether a temperature has exceeded a specific value when having received a voltage from a power supply unit; and
- performing the first process and the second process in that order when the temperature has exceeded the specific value.

* * * * *